United States Patent
Naito et al.

(10) Patent No.: US 7,309,904 B2
(45) Date of Patent: Dec. 18, 2007

(54) SEMICONDUCTOR DEVICE, MAGNETIC SENSOR, AND MAGNETIC SENSOR UNIT

(75) Inventors: Hiroshi Naito, Hamamatsu (JP); Hideki Sato, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 11/085,573

(22) Filed: Mar. 22, 2005

(65) Prior Publication Data

US 2005/0230827 A1    Oct. 20, 2005

(30) Foreign Application Priority Data

Mar. 24, 2004   (JP)   ............................. 2004-087139
Mar. 24, 2004   (JP)   ............................. 2004-087140

(51) Int. Cl.
*H01L 43/00*   (2006.01)

(52) U.S. Cl. ................. 257/421; 257/737; 257/738; 257/773; 257/786; 257/E43.001

(58) Field of Classification Search ............... 257/421, 257/E43.001
See application file for complete search history.

(56) References Cited

U.S. PATENT DOCUMENTS

| | | | |
|---|---|---|---|
| 4,908,685 A | | 3/1990 | Shibasaki et al. |
| 5,324,977 A | * | 6/1994 | Honda et al. ............... 257/421 |
| 5,618,738 A | | 4/1997 | Ao et al. |
| 6,177,731 B1 | | 1/2001 | Ishida et al. |
| 6,278,271 B1 | * | 8/2001 | Schott ........................ 324/251 |
| 6,590,389 B1 | * | 7/2003 | Shibasaki et al. ........... 324/252 |
| 2004/0227236 A1 | * | 11/2004 | Sawamoto ................... 257/734 |

FOREIGN PATENT DOCUMENTS

JP    2002-156204    5/2002

* cited by examiner

*Primary Examiner*—Sue A. Purvis
*Assistant Examiner*—Eduardo A. Rodela
(74) *Attorney, Agent, or Firm*—Dickstein Shapiro LLP

(57) ABSTRACT

A semiconductor device, comprising a semiconductor chip; a pad electrode; an electrode portion; a wiring portion. An insulating portion is formed from electrically insulating material, covering the surface of the semiconductor chip and sealing the sensor element, wiring portion and electrode portion, in a state which exposes at least the electrode portion on the surface of the semiconductor chip. The electrode portion is placed in a position which does not overlap with the sensor element in the thickness direction of the semiconductor chip.

7 Claims, 17 Drawing Sheets

SEMICONDUCTOR DEVICE, MAGNETIC SENSOR, AND MAGNETIC SENSOR UNIT

BACKGROUND OF THE INVENTION

1. Field of the Invention

This invention relates to a semiconductor device of the surface-mountable type, such as chip-size packages or similar.

This invention further relates to a magnetic sensor and magnetic sensor unit for measurement of the direction of a magnetic field.

Priority is claimed on Japanese Patent Applications No. 2004-87139, filed Mar. 24, 2004, and No. 2004-87140, filed Mar. 24, 2004, the content of which is incorporated herein by reference.

2. Description of the Related Art

Recent years have seen the appearance of LSI and other semiconductor devices formed in dimensions substantially the same as those of the semiconductor chip, such as chip-size packages (hereafter called "CSPs") and similar, and capable of surface mounting. Such technologies are attracting attention as mounting technologies suitable for smaller and lighter electronic equipment (see for example Japanese Patent Application, First Publication, No. 2002-156204).

In conventional surface-mounted semiconductor devices, a plurality of bump electrodes for electrical connection to the mounting board are arranged on the top side of the semiconductor chip, having equal widths.

That is, as shown in FIG. 12, a plurality of virtual lattice lines L21 are provided, extending in one direction (the X direction) along the surface of the semiconductor chip, so as to divide the surface of the semiconductor chip substantially equally.

Further, similarly to the above, a plurality of virtual lattice lines L22 are also provided, extending in a direction (the Y direction) along the surface and orthogonal to the X direction, so as to divide the surface of the semiconductor chip substantially equally. A plurality of bump electrodes 97 are then arranged, with one each at the intersections of these lattice lines L21, L22. Each of the bump electrodes 97 is electrically connected to a pad electrode 95 on the surface of the semiconductor chip by a wiring layer provided on the surface of the semiconductor chip.

In order to reduce the size and weight of electronic equipment, integration of semiconductor devices with functional elements is also being employed. Such semiconductor devices are provided with, for example, magnetic elements, Hall elements, piezo elements, or other sensor elements having electrical functions, arranged either together with or on the surface side of the integrated circuits on the surface of the semiconductor chip. The sensor element is placed in a prescribed position on the surface of the semiconductor chip. That is, for example in a case in which sensor elements are magnetic elements used for measurement of the direction of an external magnetic field, when the semiconductor device is mounted on a mounting board, the direction of the magnetic field to be detected by each such magnetic element must be confirmed, and the magnetic elements must be positioned at a distance from each other so as not to be affected by other elements; hence elements are arranged in the peripheral portions of the surface of the semiconductor chip or in other predetermined positions.

However, the sizes of the semiconductor chips of the above conventional semiconductor devices are themselves tending to become smaller with each passing year, so that wiring portions and bump electrodes 97 are arranged in positions which overlap with sensor elements 99 in the semiconductor chip thickness direction. In the case of such a configuration, when the semiconductor device is mounted on a mounting board, the stress of the bump electrodes 97 reaches the sensor elements 99. And in the case of such a configuration, if there is bending in the region of the mounting board on which the semiconductor device is mounted, with the semiconductor device in the mounted state on the mounting board, stress arising from the bending of the mounting board reaches the bump electrodes 97 and, via posts and wiring layers, the sensor elements 99. Moreover, when in such cases the semiconductor device is mounted or operated, heating of the semiconductor device occurs, and stress arises from thermal deformation of wiring layers at this time, so that the stress on the wiring layers also reaches the sensor elements 99.

That is, when a semiconductor device is mounted on a mounting board, or when a semiconductor device is caused to operate, the stress on the bump electrodes 97 and wiring layers reaches the sensor elements 99, and so there is the problem that the characteristics of the sensor elements 99 may fluctuate or be degraded.

Further, when sensor elements 99 may affect a magnetic field, as in the case of magnetic elements and Hall elements, if bump electrodes 97, posts and wiring layers are placed in positions overlapping with sensor elements 99, there is the problem that the characteristics of the sensor elements 99 may fluctuate due to the current-induced magnetic field arising due to current flowing in posts and wiring layers.

In the prior art, magnetic sensors are provided which detect magnetic fields for measurement of the direction in three dimensions of an external magnetic field. As this type of magnetic sensor, there are sensors in which a magneto-sensitive portion (magnetic sensor chip) is affixed to the surface of a magnetosensing surface holding plate, and the magnetosensing surface holding plate and magnetosensitive portion (magnetic sensor chip) are sealed with mold compound (see for example Japanese Patent Application, First Publication No. 2002-156204).

Here, the magnetosensitive portion is configured so as to detect magnetic components in a direction along the surface of the magnetosensing surface holding plate. The magnetosensing surface holding plate and magnetosensitive portion are covered by mold compound in a state of contact with the surface of the circuit board or other element supporting portion and inclined with respect to the horizontal base. That is, in the state in which the magnetic sensor is mounted on the element supporting portion, the plate and the magnetosensitive portion are inclined with respect to the surface of the element supporting portion. By providing two of the magnetic sensors on the element supporting portion, such that the directions of inclination of the two magnetosensitive portions with respect to the surface of the element supporting portion are different, the three-dimensional direction of an external magnetic field can be measured.

However, in the case of a magnetic sensor with the above configuration, the magnetosensitive portion is affixed to the surface of the magnetosensing surface holding plate using silver paste. At the time of this affixing, the silver paste must be melted, so that the magnetosensitive portion and the magnetosensing surface holding plate are heated to elevated temperatures.

However, in the case of the above magnetic sensor of the prior art, because the magnetosensing surface holding plate and the magnetosensitive portion are heated, when the magnetosensing surface holding plate and the magnetosensitive portion comprise materials with different thermal expansion coefficients, bending of the magnetosensitive portion occurs due to the difference in thermal expansion coefficients. And when bending occurs in the magnetosensitive portion, there is the problem that the characteristics of the magnetosensitive portion are degraded, and the three-dimensional direction of an external magnetic field cannot be measured accurately.

This invention was devised in light of the above-described circumstances, and has as an object the provision of a semiconductor device which can suppress fluctuations in and degradation of the characteristics of a sensor element provided on the surface of a semiconductor chip.

This invention was devised in light of the above-described circumstances, and has as a further object the provision of a magnetic sensor and magnetic sensor unit which prevent degradation of the characteristics of a magnetic sensor chip, and enable accurate measurement of the three-dimensional direction of a magnetic field.

SUMMARY OF THE INVENTION

In order to resolve the above problems, in this invention the following means are proposed.

The invention of first aspect proposes a semiconductor device, comprising a semiconductor chip on the surface of which are formed integrated circuitry and a sensor element, electrically connected thereto; a pad electrode, formed on the surface side of the semiconductor chip, and electrically connected to at least the integrated circuitry; an electrode portion, positioned on the surface side of the semiconductor chip, and electrically connecting the semiconductor chip to external circuitry; a wiring portion, electrically connecting the pad electrodes to the electrode portion; and an insulating portion, formed from electrically insulating material, which covers the surface of the semiconductor chip and seals the sensor element, wiring portion, and electrode portion, in a state which exposes, at least, the electrode portion on the surface side of the semiconductor chip; and characterized in that the electrode portion is arranged in a position which does not overlap with the sensor element in the thickness direction of the semiconductor chip.

Here, "sensor element" denotes an element having electrical functions such as those of a magnetic element, a Hall element, a piezo element, or similar.

By means of a semiconductor device of this invention, when mounting the semiconductor device on a mounting board as an external circuit, the semiconductor device is pressed against the mounting surface of the mounting board in a state in which the surface side of the semiconductor chip faces the mounting surface of the mounting board. Here, the sensor element and electrode portion are arranged in positions which do not overlap, and the stress at the electrode portion due to the pressing which reaches the sensor element can be reduced.

Further, even in cases in which there is bending of the mounting surface of the mounting board when mounting the semiconductor device, stress arising from the bending of the mounting board which reaches the sensor element from the electrode portion can be reduced.

Moreover, when causing the semiconductor device to operate, an electromagnetic field arises due to the current flowing in the electrode portion, but because the sensor element and electrode portion are arranged at a distance, even when the sensor element is affected by a magnetic field, as in the case of a magnetic element or Hall element, the effect of the current-induced magnetic field of the electrode portion on the sensor element can be reduced.

The invention of a second aspect proposes the semiconductor device characterized in that the wiring portion is arranged in a position which does not overlap with the sensor element in the thickness direction of the semiconductor chip.

By means of a semiconductor device of this invention, when there is bending of the mounting surface of the mounting board on which the semiconductor device is mounted, even if stress arising from the bending of the mounting board in the state in which the semiconductor device 1 is mounted on the mounting surface reaches the wiring portion from the electrode portion, the stress reaching the sensor element can be reduced.

Further, when the semiconductor device is mounted on the mounting board or when the semiconductor device is caused to operate, the semiconductor device is heated and thermal deformation of the wiring portion occurs; but even if stress on the wiring portion occurs due to this thermal deformation, the stress of the wiring portion which reaches the sensor element can be reduced.

Moreover, when the semiconductor device is caused to be operated, a current-induced magnetic field occurs due to the current flowing in the wiring portion; but because the sensor element and the wiring portion do not overlap, even when the sensor element is affected by a magnetic field, as in the case of a magnetic element or Hall element, the effect of the current-induced magnetic field of the wiring portion on the sensor element can be reduced.

The invention of a third aspect proposes the semiconductor device characterized in that a plurality of the above electrode portions are provided, a plurality of first lattice lines are supposed, extending in one direction on the surface of the semiconductor chip, arranged at substantially equal intervals so as to substantially equally divide the surface, a plurality of second lattice lines are supposed, on the surface and intersecting with the first lattice lines, arranged at substantially equal intervals, and each of the points of intersection of the first lattice lines and the second lattice lines are taken to be virtual placement positions for the electrode portions; characterized in that, among the electrode portions, one electrode portion which does not overlap with the sensor element in the thickness direction is placed in the virtual placement position, and the other electrode portions among the above electrode portions are placed in positions moved, from the virtual placement position, in a direction away from the sensor element along first lattice lines or along second lattice lines, and on the first lattice lines or on the second lattice lines, the number of electrode portions placed between adjacent lattice lines is one or less.

By means of a semiconductor device of this invention, the distances between the other electrode portions shifted from the virtual placement positions and the virtual placement positions are shorter than the distances between virtual placement positions which are adjacent along the first and second lattice lines (distances between adjacent lattice lines), and by making the number of electrode portions placed between adjacent lattice lines equal to one or less, the distances between adjacent electrode portions can be maintained to be equal to or greater than the distances between the placement positions.

The invention of a fourth aspect proposes the semiconductor device characterized in that a plurality of the above sensor elements and a plurality of the above electrode portions are provided, and the positional relationship between each of the sensor elements and the electrode portions placed in the environs of the sensor element, as well as the number of electrode portions placed in the environs of each sensor element, are the same for all of the sensor elements.

By means of a semiconductor device of this invention, even if stress is applied to electrode portions at the time of mounting on a mounting board, all of the sensor elements each receive stress of the same magnitude from the electrode portions in the environs thereof, so that the characteristics of all the sensor elements are modified equally.

The invention of a fifth aspect proposes the semiconductor device characterized in that one electrode portion placed in a position adjacent to the above sensor element is formed to be small compared with other electrode portions placed at a further distance from the sensor element than the one electrode portion.

By means of a semiconductor device of this invention, by forming one electrode portion adjacent to a sensor element to be smaller than other electrode portions, the electrode portion can easily be placed in a position which does not overlap with the sensor element, without modifying the placement of the electrode portion.

The invention of a sixth aspect proposes a semiconductor device, comprising a semiconductor chip on the surface of which are formed integrated circuitry and a sensor element, electrically connected thereto; a pad electrode, formed on the surface side of the semiconductor chip, and electrically connected to at least the integrated circuitry; a plurality of electrode portions, positioned on the surface side of the semiconductor chip, and electrically connecting the semiconductor chip to external circuitry; a wiring portion, electrically connecting the pad electrode to the electrode portions; and an insulating portion, formed from electrically insulating material, which covers the surface of the semiconductor chip and seals the sensor element, wiring portion, and electrode portions, in a state which exposes, at least, the electrode portion on the surface side of the semiconductor chip; and characterized in that the electrode portions comprise protruding portions which protrude from the insulating portion in the thickness direction of the semiconductor chip, and in that one protruding portion placed adjacently to the sensor element has a smaller protrusion length from the insulating portion compared with other protruding portions placed at a distance from the sensor element.

By means of a semiconductor device of this invention, when the semiconductor device is mounted on the mounting surface of a mounting board, the other protruding portions make contact with the mounting surface of the mounting board before the one protruding portion. Consequently even if the electrode portion having the one protruding portion is placed in a position overlapping the sensor element in the semiconductor chip thickness direction, the stress on the electrode portion having the one protruding portion can be relaxed at the time of mounting of the semiconductor device on the mounting board, and the stress of the electrode portion having the one protruding portion which reaches the sensor element can also be reduced.

The invention of a seventh aspect proposes a semiconductor device, comprising a semiconductor chip on the surface of which are formed integrated circuitry and a sensor element, electrically connected thereto; a pad electrode, formed on the surface side of the semiconductor chip, and electrically connected to at least the integrated circuitry; a plurality of electrode portions, positioned on the surface side of the semiconductor chip, and electrically connecting the semiconductor chip to external circuitry; a wiring portion, electrically connecting the pad electrode to the electrode portions; and an insulating portion, formed from electrically insulating material, which covers the surface of the semiconductor chip and seals the sensor element, wiring portion, and electrode portions, in a state which exposes, at least, the electrode portion on the surface side of the semiconductor chip; and characterized in that the electrode portions comprise protruding portions which protrude from the insulating portion in the thickness direction of the semiconductor chip, and in that one protruding portion placed adjacently to the sensor element is formed from a conductive material having a lower melting point compared with other protruding portions placed at a distance from the sensor element.

By means of a semiconductor device of this invention, when the semiconductor device is mounted on the mounting surface of a mounting board while applying heat to protruding portions, the one protruding portion melts before the other protruding portions, so that stress concentrates more on the electrode portions having the other protruding portions than on the electrode portion having the one protruding portion. Hence even if the electrode portion having the one protruding portion is placed in a position which overlaps the sensor element in the semiconductor chip thickness direction, the stress on the electrode portion having the one protruding portion can be relaxed, and the stress on this electrode portion which reaches the sensor element can be reduced.

The invention of an eighth aspect proposes a semiconductor device, comprising a semiconductor chip on the surface of which are formed integrated circuitry and a sensor element, electrically connected thereto; a pad electrode, formed on the surface side of the semiconductor chip, and electrically connected to at least the integrated circuitry; a plurality of electrode portions, positioned on the surface side of the semiconductor chip, and electrically connecting the semiconductor chip to external circuitry; a wiring portion, electrically connecting the pad electrode to the electrode portions; and an insulating portion, formed from electrically insulating material, which covers the surface of the semiconductor chip and seals the sensor element, wiring portion, and electrode portions, in a state which exposes, at least, the electrode portion on the surface side of the semiconductor chip; and characterized in that the electrode portions comprise protruding portions which protrude from the insulating portion in the thickness direction of the semiconductor chip; in that the protruding portions comprise a substantially spherical core formed from a conductive material and a shell portion, covering the periphery of the core, and formed from a conductive material with a melting point lower than that of the above conductive material; in that the core of one protruding portion placed adjacent to the sensor element is formed to be smaller than the cores of other protruding portions placed at a distance from the sensor element; and in that the diameters of the shell portions of the one protruding portion and of the other protruding portions are substantially equal.

By means of a semiconductor device of this invention, when the semiconductor device is mounted on a mounting board with protruding portions heated to a temperature which is lower than the melting point of the conductive material from which the cores are formed but higher than the melting point of the conductive material from which the shell portions are formed, only the shell portions of the protruding portions are melted, so that the cores of the other protruding portions, with large diameters, make contact with the mounting surface, while the core of the one protruding portion, with a small diameter, does not make contact with the mounting surface. At this time, stress is concentrated at the other protruding portions, so that even if the electrode portion having the one protruding portion is placed at a position overlapping with the sensor element in the semiconductor chip thickness direction, the stress on the electrode portion having the one protruding portion can be relaxed, and the stress of the electrode portion which reaches the sensor element can be reduced.

By means of the inventions of the first and second aspects, even when a semiconductor device is mounted on a mounting board or is caused to operate, stress at the electrode portions and wiring portions which reaches the sensor element can be reduced, and moreover the effect of current-induced magnetic fields of electrode portions and wiring portions on the sensor element can also be decreased, so that fluctuations and degradation of the characteristics of the sensor element can be suppressed.

By means of the invention of a third aspect, the distances between electrode portions can be kept equal to or greater than the distances between virtual placement positions along first and second lattice lines, so that even if electrode portions are shifted from virtual placement positions, short-circuiting of circuits across these electrode portions can be reliably prevented.

By means of the invention of a fourth aspect, even if stress is born by electrode portions at the time of mounting on a mounting board, fluctuations due to the same stress can be cancelled out by having the sensor elements form a bridge, so that the sensitivity of sensor elements is stable regardless of stress.

By means of the invention of the fifth aspect, by forming one electrode portion adjacent to a sensor element smaller than other electrode portions, the electrode portion can easily be placed in a position not overlapping with the sensor element, without modifying the placement of the electrode portion.

By means of the inventions of the sixth to eighth aspects, even if one electrode portion having a protruding portion is placed in a position which overlaps a sensor element in the semiconductor chip thickness direction, when the semiconductor device is mounted on the mounting surface of the mounting board, the stress at the one electrode portion comprising a protruding portion which reaches the sensor element can be reduced, so that fluctuations and degradation of the characteristics of the sensor element can be suppressed.

The invention of a ninth aspect proposes a magnetic sensor, comprising a magnetic sensor chip, formed substantially into a sheet shape, which is sensitive to the magnetic component in at least one direction of a magnetic field, and a plurality of electrode portions, protruding from the surface of the magnetic sensor chip, which electrically connect the magnetic sensor chip to a substantially sheet-shaped circuit board, and characterized in that the electrode portions are arranged in a row on the surface of the magnetic sensor chip.

When mounting the magnetic sensor of this invention on a circuit board, the plurality of electrode portions are brought into contact with the surface of the circuit board, and the magnetic sensor chip is electrically connected to the circuit board. At this time, the plurality of electrode portions, arranged in a row, protrude from the surface of the magnetic sensor chip, so that an edge portion of the magnetic sensor chip is also in contact with the surface of the circuit board. In this state, the magnetic sensor chip is inclined with respect to the surface of the circuit board, so that the direction of magnetic sensitivity of the magnetic sensor chip is inclined with respect to the surface of the circuit board, and a magnetic component in a direction intersecting the surface of the circuit board can be detected by the magnetic sensor chip.

Further, it is sufficient to fix at least the electrode portions of the magnetic sensor to the surface of the circuit board, so that the magnetic sensor can be mounted on the circuit board with the magnetic sensor chip inclined, without heating of the entire magnetic sensor chip.

The invention of a tenth aspect proposes a magnetic sensor, comprising a magnetic sensor chip, formed substantially into a sheet shape, which is sensitive to the magnetic component in at least one direction of a magnetic field, and a plurality of electrode portions, protruding from the surface of the magnetic sensor chip, which electrically connect the magnetic sensor chip to a substantially sheet-shaped circuit board, and characterized in that the electrode portions are arranged in a plurality of parallel rows on the surface of the magnetic sensor chip, and in that the protrusion lengths of the electrode portions gradually become shorter in the direction of arrangement of the plurality of rows.

When mounting the magnetic sensor of this invention on a circuit board, the plurality of electrode portions are brought into contact with the surface of the circuit board, and the magnetic sensor chip is electrically connected to the circuit board. In this state, because the protrusion lengths of the electrode portions gradually become shorter in the direction of arrangement of the plurality of rows, the magnetic sensor chip is inclined with respect to the surface of the circuit board. Hence the direction of sensitivity of the magnetic sensor chip is inclined with respect to the surface of the circuit board, and a magnetic component in a direction intersecting the surface of the circuit board can be detected.

Further, it is sufficient to fix the electrode portions of the magnetic sensor to the surface of the circuit board, so that the magnetic sensor can be mounted on the circuit board with the magnetic sensor chip inclined, without heating of the entire magnetic sensor chip.

Moreover, when the number of electrode portions provided on the surface of the magnetic sensor chip is determined in advance, by arranging the electrode portions separated into a plurality of rows, the number of electrode portions placed in each row can be reduced, so that the magnetic sensor chip can be formed in a smaller size.

The invention of an eleventh aspect proposes a magnetic sensor unit, comprising two of the magnetic sensors according to the ninth or tenth aspect, and a circuit board on which are mounted the magnetic sensors with the electrode portions caused to be in contact with the board surface, and characterized in that the magnetic sensor chip of at least one of the magnetic sensors is sensitive to magnetic components of a magnetic field in two directions, and that the magnetic sensors are placed on the circuit board such that the direction of sensitivity of the other magnetic sensor chip intersects the plane comprising the two directions of sensitivity of the one magnetic sensor chip.

The invention of a twelfth aspect proposes a magnetic sensor unit, comprising two of the magnetic sensors according to the ninth or tenth aspect, and a circuit board on which are mounted the magnetic sensors with the electrode portions caused to be in contact with the board surface, and characterized in that the magnetic sensor chip of at least one of the magnetic sensors is sensitive to magnetic components of a magnetic field in two directions, and that the two magnetic sensors are placed to at least partially overlap on the circuit board such that the direction of sensitivity of the other magnetic sensor chip intersects the plane comprising the two directions of sensitivity of the one magnetic sensor chip.

By means of a magnetic sensor unit of these inventions, two magnetic sensors are prepared in advance, and a magnetic sensor unit is configured such that the directions of sensitivity of the magnetic sensor chips intersect. That is, one of the magnetic sensor chips can detect magnetic components in any direction within a plane comprising two sensitivity directions, and the other magnetic sensor chip can detect magnetic components in a direction intersecting the plane. Consequently three magnetic components in three-dimensional space can be detected by the two magnetic sensor chips, so that the direction of the magnetic field can be measured as a vector in three-dimensional space.

When placing two magnetic sensors on a circuit board surface to overlap, the mounting area of the two magnetic sensors on the surface of the circuit board can be decreased, so that the magnetic sensor unit can be made smaller.

The invention of a thirteen aspect proposes a magnetic sensor unit, comprising a first magnetic sensor which is sensitive to the magnetic components of a magnetic field in two directions, a second magnetic sensor which is sensitive to the magnetic component of a magnetic field in at least one direction, and a substantially sheet-shaped circuit board on the surface of which the two magnetic sensors are mounted, and characterized in that each of the magnetic sensors comprises a magnetic sensor chip formed in substantially a sheet shape, and a plurality of electrode portions, protruding from the surface of the magnetic sensor chip, which are brought into contact with the surface of the circuit board and are electrically connected to the circuit board, and in that at least one of the magnetic sensor chips is caused to be inclined with respect to the rear surface of the circuit board, such that the direction of sensitivity of the second magnetic sensor intersects the plane comprising the two directions of sensitivity of the first magnetic sensor, and moreover the sum of the height dimensions in the circuit board thickness direction of the circuit board and of the electrode portions is changed in portions.

By means of the magnetic sensor unit of this invention, the first magnetic sensor can detect magnetic components in all directions within a plane comprising the two sensitive directions, and the second magnetic sensor can detect the magnetic component in a direction intersecting this plane, so that by means of these two magnetic sensors, three magnetic components in three-dimensional space can be detected, and so the direction of a magnetic field can be measured as a vector in three-dimensional space.

Further, the two magnetic sensors can be fixed onto the circuit board with the electrode portions in contact with the surface of the circuit board, so that each of the magnetic sensors can be mounted on the circuit board with the two magnetic sensor chips inclined relative to each other, without heating the entirety of the magnetic sensor chips.

The invention of a fourteen aspect proposes the semiconductor device characterized in that the surface of the circuit board is formed in a staircase shape, and that the electrode portions of at least one magnetic sensor are placed on separate steps.

By means of the magnetic sensor unit of this invention, because the heights from the rear face of the circuit board to the tops of each of the steps are different, even if the protrusion lengths of the plurality of electrode portions provided on the surface of a magnetic sensor chip are the same, the magnetic sensor chip can easily be inclined with respect to the surface of the circuit board.

By means of the inventions of the ninth and tenth aspects, when a magnetic sensor is mounted at an inclination on the circuit board, the entirety of the magnetic sensor chip is not heated, so that fluctuations and degradation of the characteristics of the magnetic sensor chip can be prevented, and the direction of a magnetic field can be correctly measured.

Further, by means of the invention of the tenth aspect, by arranging the electrode portions divided into a plurality of rows, the magnetic sensor chip can be formed in a small size, and the size of the magnetic sensor can be reduced.

By means of the inventions of the eleventh and twelfth aspects, a magnetic sensor is used which enabled prevention of fluctuations and degradation of the characteristics of magnetic sensor chips, so that the three-dimensional direction of a magnetic field can be correctly measured.

Further, by means of the invention of the twelfth aspect, the mounting area of two magnetic sensors on the surface of a circuit board can be reduced, so that the size of the magnetic sensor unit can be reduced.

By means of the invention of the thirteen aspect, when mounting each magnetic sensor on the circuit board such that the two magnetic sensor chips are inclined with respect to each other, the entirety of the magnetic sensor chips is not heated, so that fluctuations and degradation of the characteristics of the magnetic sensor chips can be prevented, and the three-dimensional direction of a magnetic field can be correctly measured.

By means of the invention of the fourteen aspect, the heights from the rear surface of the circuit board to the top of each step are different, so that the magnetic sensor chips can easily be inclined with respect to the surface of the circuit board.

BRIEF DESCRIPTION OF THE DRAWINGS

FIG. 9 shows solder balls of the semiconductor device of another aspect of the invention, wherein

FIG. 22 shows a magnetic sensor of another aspect of the invention, wherein

FIG. 26 shows a magnetic sensor of another aspect of the invention, wherein

DESCRIPTION OF THE PREFERRED EMBODIMENTS

Figure 1:
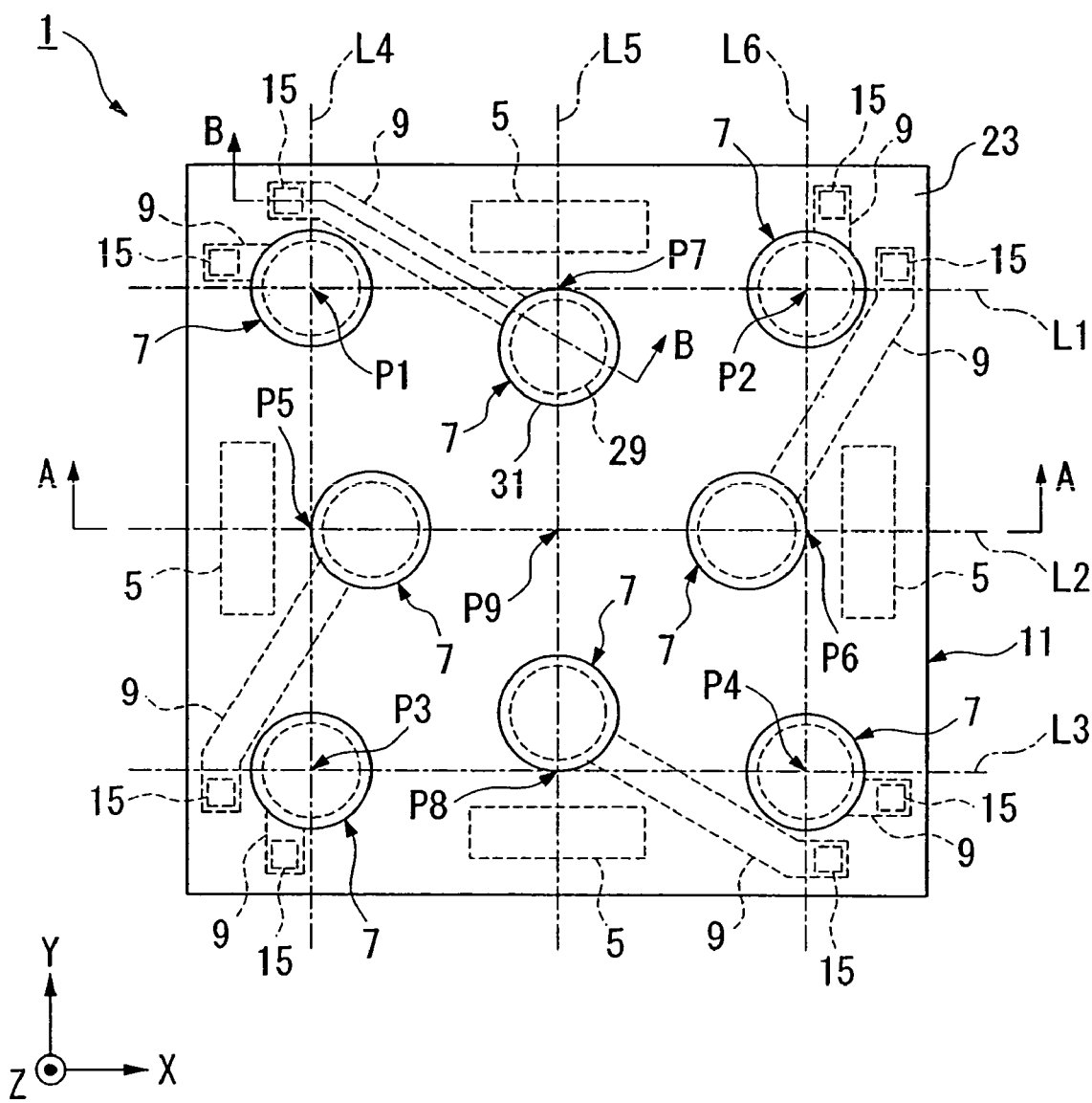
FIG. 1 is a summary plane view showing the semiconductor device of one aspect of the invention.
Figure 2:
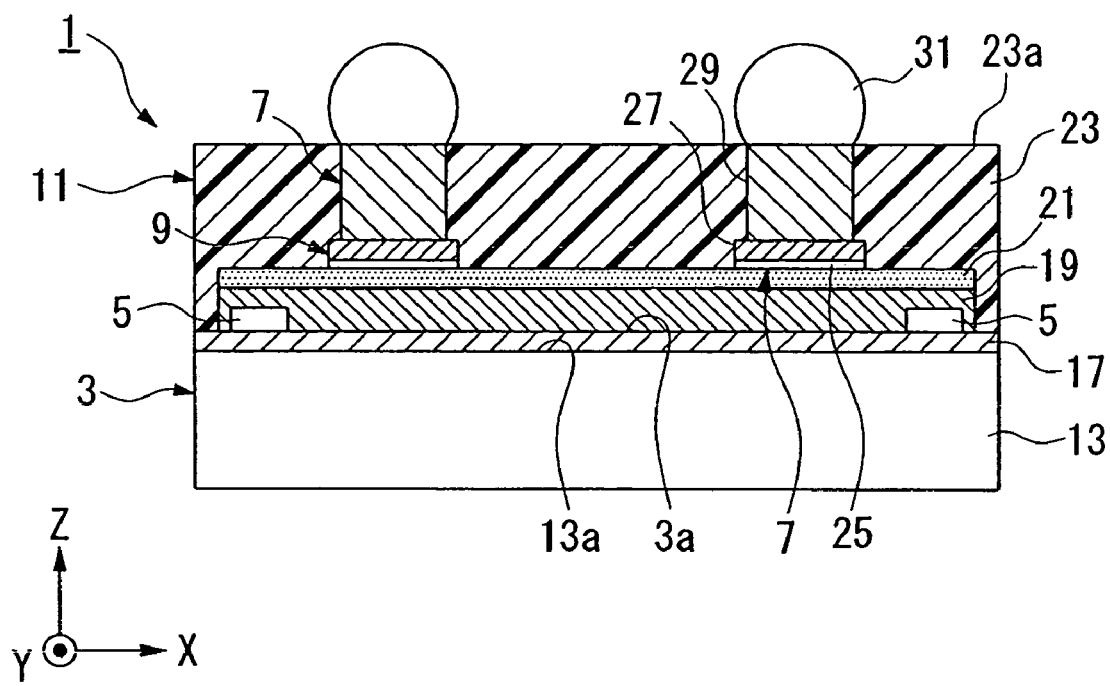
FIG. 2 is a cross-sectional view along arrow A-A of the semiconductor device in FIG. 1.
Figure 3:
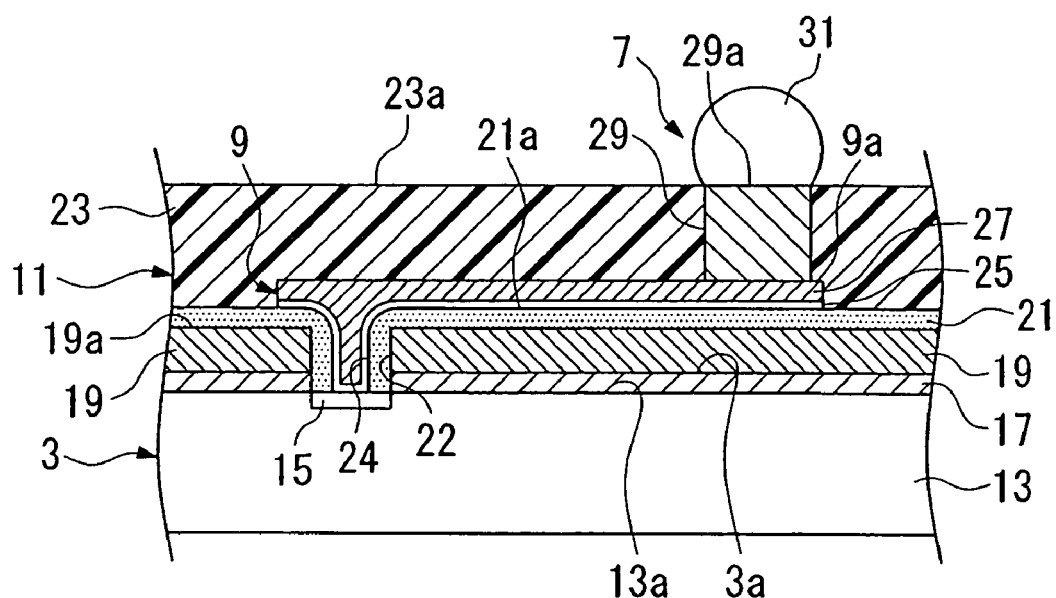
FIG. 3 is a cross-sectional view along arrow B-B of the semiconductor device in FIG. 1.

FIG. 1 to FIG. 3 show one aspect of the invention; the semiconductor device of this aspect is one type of wafer-level CSP (hereafter called a "WLCSP"), with electrodes for connection to the external circuitry of the mounting board provided at positions which do not protrude from the main face of the semiconductor chip on which the integrated circuits are formed. As shown in FIG. 1 and FIG. 2, this semiconductor device 1 comprises a semiconductor chip 3 in a sheet shape, formed into substantially a rectangular shape in plane view; a plurality of thin film magnetic elements 5, provided on the main face (surface) of the semiconductor chip 3; electrode portions 7, placed on the side of the main face 3a of the semiconductor chip 3, for connection of the semiconductor chip 3 to external circuitry; wiring portions 9 for electrical interconnection of the integrated circuits (not shown) of the semiconductor chip 3 and the electrode portions 7; and an insulating portion 11 which covers the surface 3a of the semiconductor chip 3 in a state which exposes the electrode portions 7 on the side of the main face 3a of the semiconductor chip 3, and which seals the thin film magnetic elements 5, wiring portions 9, and electrode portions 7.

The thin film magnetic elements 5 are formed as a thin film, and measure the sense and magnitude of an external magnetic field. Four such thin film magnetic elements 5 are placed on the periphery of the main face 3a of the semiconductor chip 3. Each of the thin film magnetic elements 5 is sensitive to the magnetic component of an external magnetic field in one direction (in the X-axis direction or in the Y-axis direction), and is placed such that the direction of sensitivity is along the main face 3a of the semiconductor chip 3. These thin film magnetic elements 5 are each placed adjacent to one edge of the main face 3a of the semiconductor chip 3, at a distance from each other. Pairs of opposing thin film magnetic elements 5, 5 are configured so as to detect the magnetic component in the same direction, to improve the reliability of detection of an external magnetic field.

As shown in FIG. 1 and FIG. 3, the semiconductor chip 3 comprises a substrate 13, of rectangular shape in plane view, on the surface 13a of which is formed integrated circuitry; a plurality of (in the example shown, eight) pad electrodes 15, formed on the surface 13a of the substrate 13; and a first passivation film 17 provided on the surface 13a of the substrate 13, avoiding the pad electrodes 15. The pad electrodes 15 electrically connect the electrode portions 7 and the thin film magnetic elements 5, and are placed on the periphery of the surface 13a of the substrate 13.

The first passivation film 17 is formed by layering on the surface 13a of the substrate 13, in order, a thin film of silicon dioxide ($SiO_2$) and a thin film of silicon nitride (SiN), avoiding the pad electrodes 15. The first passivation film 17 has high heat resistance and is electrically insulating. The surface of the first passivation film 17 constitutes the main face 3a of the semiconductor chip 3.

The insulating portion 11 is obtained by layering in order on the main face 3a of the semiconductor chip 3 a second passivation film 19, a protective film 21, and a resin mold portion 23; this second passivation film 19, protective film 21, and resin mold portion 23 are each formed from electrically insulating materials.

The second passivation film 19, like the first passivation film 17, is formed by layering in order, from the main face 3a of the semiconductor chip 3, a thin film of silicon dioxide ($SiO_2$) and a thin film of silicon nitride (SiN), formed so as to cover the first passivation film 17 while avoiding the pad electrodes 15 used for electrical connection to the wiring portions 9. The thin film magnetic elements 5 are covered by this second passivation film 19.

The protective film 21 is formed from polyimide (PI), and is formed so as to cover the surface 19a of the second passivation film 19a and the side wall faces of the groove portion 22 demarcated by the pad electrodes 15 and the first and second passivation films 17, 19.

The resin mold portion 23 covers the surface 21a of the protective film 21 and main face 3a of the semiconductor chip 3, and in addition is formed so as to seal the post of the electrode portions 7, described below, and the wiring portions 9. The resin mold portion 23 is formed from resin material with a lower hardness than the electrode portions 7 and wiring portions 9, and is formed into a substantially rectangular shape in plane view, similarly to the magnetic sensor chip 3.

The wiring portions 9 fill the groove portions 24 demarcated by the pad electrodes 15 and protective film 19, and in addition are formed to extend from the aperture of the groove portion 24 between the protective film 21 and the resin mold portion 23 of the insulating portion 11, to the lower edge of the posts of the electrode portions 7, described below. The wiring portions 9 are formed by layering in order, from the surface 21a of the protective film 21, of under-barrier metal 25 (hereafter "UBM") and the wiring layer 27. The UBM 25 is formed from titanium (Ti) or chromium (Cr), whereas the wiring layer 27 is formed from copper (Cu).

The UBM 25 is formed to be sufficiently thinner than the wiring layer 27. That is, the thickness of the UBM 25 is for example 0.18 μm, whereas the thickness of the wiring layer 27 is 0.60 μm.

Wiring portions 9 configured as described above are formed in positions which do not overlap, in the thickness direction of the semiconductor chip 3, with the thin film magnetic elements 5.

Each of the electrode portions 7 comprises a substantially cylindrical post 29, extending from the surface 9a of the wiring portion 9 to the surface 23a of the resin mold portion 23, and a solder ball 31, mounted on the top end of the post 29, and protruding from the surface 23a of the resin mold portion 23. The post 29 is formed from copper, and the top end face 29a thereof is formed in substantially the same plane as the surface 23a of the resin mold portion 23. The solder ball 31 is solder material formed into a substantially spherical shape.

A plurality of electrode portions 7 are placed at prescribed positions which do not overlap, in the thickness direction of the semiconductor chip 3, with thin film magnetic elements 5. That is, three first lattice lines L1 to L3 extending in the X-axis direction, as well as three second lattice lines L4 to L6 extending in the Y-axis direction, so as to substantially equally divide the main face 3a of the semiconductor chip 3 and the surface 23a of the resin mold portion 23, are supposed to be arranged at equal intervals.

The distances between the points of intersection (virtual placement positions) P1 to P9 along the lattice lines L1 to L6 are distances sufficient that no short-circuits occur between adjacent electrode portions 7 in the state in which electrode portions are placed at each of the points of intersection.

Among the three lattice lines placed and arranged at equal intervals in each direction, the lines in the center which are the first lattice line L2 and the second lattice line L5 are placed so as to pass through thin film magnetic elements 5.

One each of the electrode portions 7 are placed at first points of intersection P1 to P4, at which the first lattice lines L1, L3 and the second lattice lines L4, L6 intersect. These first points of intersection P1 to P4 are positioned at a distance from the thin film magnetic elements 5.

Electrode portions 7 are placed at positions shifted from the second points of intersection P5, P6 of the first lattice line L2 with the second lattice lines L4, L6 along the first lattice line L2 toward the fourth point of intersection P9 at which the first lattice line L2 intersects the second lattice line L5. And, electrode portions 7 are placed at positions shifted from the third points of intersection P7, P8 of the first lattice lines L1, L3 and the second lattice line L5 toward the fourth point of intersection P9 along the second lattice line L5, so as to increase the distance from the thin film magnetic sensors 5.

This is because the second points of intersection P5, P6 and the third points of intersection P7, P8 are adjacent to the thin film magnetic sensors 5, and if electrode portions were placed at the second points of intersection P5, P6 and the third points of intersection P7, P8, the electrode portions 7 would overlap with the thin film magnetic elements 5 in the thickness direction of the semiconductor chip 3.

As a result, the electrode portions 7 are placed in positions which do not overlap with thin film magnetic elements 5 in the thickness direction of the semiconductor chip 3.

The above-described positions which do not overlap with thin film magnetic elements 5 are in a positional relationship such that the figures of the thin film magnetic elements 5 projected onto a plane the normal to which is the mounting direction or the loading direction, and the figures in the contact plane of solder balls 31 in contact with the top end faces 29a of posts 29 or with the surfaces 23a of resin mold portions 23, or the figures of the electrode portions 7, do not overlap at least partially.

In the case of this embodiment, the thickness direction of the semiconductor chip 3 is the above mounting direction and loading direction, so that when projecting figures onto a plane the normal to which is substantially the thickness direction, each of the above-described figures exists independently, and need only be in a state in which there is no interference. Here, the mounting direction signifies the direction in which a load is applied when mounting the semiconductor device 1 on a mounting board, and the load direction signifies the direction in which a load is applied after mounting the semiconductor device 1 on a mounting board.

These electrode portions 7 are placed such that the positional relationships between each of the thin film magnetic elements and the electrode portions 7 placed in the environs of the thin film magnetic elements 5, and the number of electrode portions 7 placed in the environs of each thin film magnetic element 5, are the same for all thin film magnetic elements 5. That is, three electrode portions 7 are placed in the environs of each of the thin film magnetic elements 5. Three electrode portions 7 are placed in the same positions, with reference to the placement positions of each of the thin film magnetic elements 5.

A method of manufacture of a semiconductor device 1 configured as described above is here explained.

Figure 4:
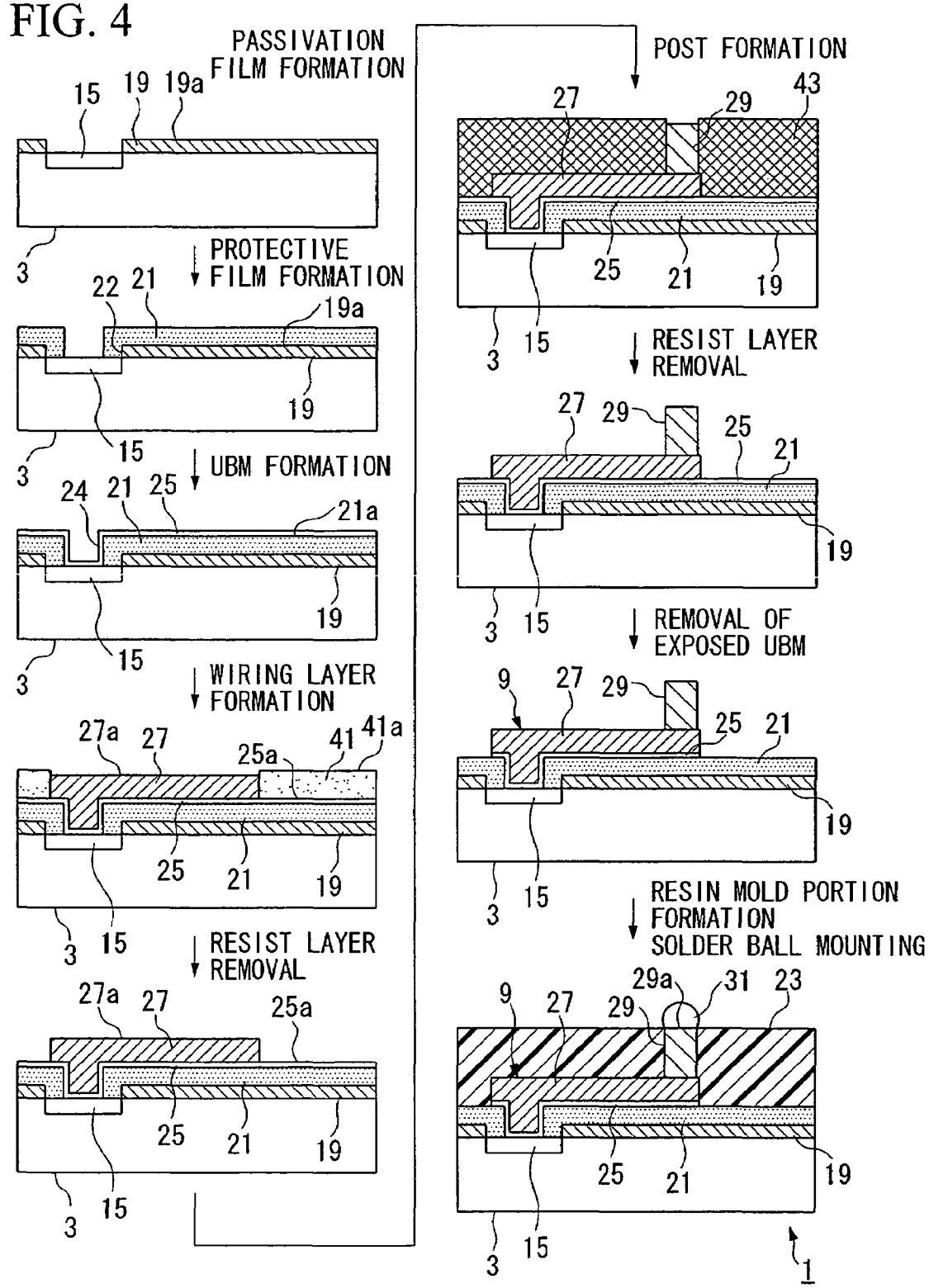
FIG. 4 shows schematically the method of manufacture of the semiconductor device of FIG. 1.

First, four thin film magnetic elements 5 are placed at prescribed positions of the main face 3a of the semiconductor chip 3, and as shown in FIG. 4, a second passivation film 19 is formed on the main face 3a of the semiconductor chip 3, avoiding the pad electrodes 15. At this time, the thin film magnetic elements 5 are also covered by the second passivation film 19.

Next, a protective film 21 is formed on the surface 19a of the second passivation film 19 and on the side wall faces of the groove portion 22, and a thin film UBM 25 is formed on the surface 21a of the protective film 21 and on the wide wall faces and bottom wall face of the groove portion 24.

Then, a first resist layer 41 is formed on the surface 25a of the UBM 25, excluding the portions where the wiring layer 27 is to be formed. This region of formation of the first resist layer 41 comprises a region of overlap, in the thickness direction of the semiconductor chip 3, with the thin film magnetic elements 5. Then, portions in which the first resist layer 41 is not formed, that is, portions in which the UBM 25 is exposed are buried with copper to form the wiring layer 27. After this, the first resist layer 41 is removed.

Then, a second resist layer 43 is formed on the surfaces 27a, 25a of the wiring layer 27, excluding portions where posts 29 are to be formed, and of the UBM 25. In this state, only a portion of the surface 27a of the wiring layer 27 is exposed. The portion in which the second resist layer 43 is not formed, that is, the portion in which the wiring layer 27 is exposed, is then buried with copper to form posts 29. After formation of the wiring layer 27 and posts 29, the second resist layer 43 is removed, and the UBM 25 not covered by the wiring layer 27 is removed by etching.

Finally, the wiring portion 9 and posts 29 are sealed with a resin material so as to cover the surface 21a of the protective film 21 and expose the top end faces 29a of the posts 29, and by depositing solder balls 31 onto the top end faces 29a of the posts 29, manufacture of the semiconductor device 1 is completed.

When mounting the semiconductor device 1 in the mounting surface of a mounting board, with the surface 23*a* of the resin mold portion 23 opposing the mounting surface, the semiconductor device 1 is pressed against the mounting surface while heating the solder balls 31. As shown in FIG. 1 and FIG. 2, the thin film magnetic elements 5 and the electrode portions 9 and wiring portions 9 are placed in positions which do not overlap, so that stress applied to electrode portions 7 by the above pressing which reaches the thin film magnetic elements can be reduced.

When there is bending in the mounting surface of the mounting substrate, in the state with the semiconductor device 1 mounted on the mounting surface, even if stress arising from the bending reaches the wiring portions 9 from the electrode portions 7, the stress reaching the thin film magnetic elements 5 as well can be reduced.

When causing the semiconductor device 1 to operate, a current-induced magnetic field arises due to the currents flowing in the electrode portions 7 and wiring portions 9, but because the thin film magnetic elements 5 are placed in positions which do not overlap with the electrode portions 7 or wiring portions 9, the effect of the current-induced magnetic field of the electrode portions 7 and wiring portions 9 on the thin film magnetic elements 5 can be reduced.

Further, when mounting the semiconductor device 1 on a mounting substrate or causing the semiconductor device 1 to operate, the semiconductor device 1 is heated, and thermal deformation of wiring portions 9 occurs; but even if stress arises in the wiring portions 9 due to this thermal deformation, the stress arising from the thermal deformation which reaches the thin film magnetic elements 5 can be reduced.

By means of the above semiconductor device 1, even when the semiconductor device 1 is mounted on a mounting substrate or caused to operate, stress in the electrode portions 7 and wiring portions 9 which reaches the thin film magnetic elements 5 can be reduced, and the effect of current-induced magnetic fields of the electrode portions 7 and wiring portions 9 on the thin film magnetic elements 5 can be decreased, so that fluctuations and degradation of the characteristics of the thin film magnetic elements 5 can be suppressed.

The distances from electrode portions 7 shifted from the second and third points of intersection P5 to P8 along the lattice lines L2 and L5 so as to increase the distance from thin film magnetic elements 5 to the fourth point of intersection) 9 is made shorter than the distances between the adjacent points of intersection P1 to P9 along the lattice lines L1 to L6 (distances between adjacent lattice lines), and electrode portions 7 are completely comprised within the lattice lines; because the number of electrode portions 7 positioned between adjacent lattice lines is one or fewer, no electrode portion 7 is placed at the fourth point of intersection P9, so that the distances between adjacent electrode portions 7 can be kept equal to or greater than the distances between the points of intersection P1 to P9. Hence even if the electrode portions 7 are shifted from the second and third points of intersection P5 to P8, short-circuits between these electrode portions 7 can be reliably prevented.

By making the positional relationships between each of the thin film magnetic elements 5 and the electrode portions 7 placed in the environs of the thin film magnetic elements 5, and the number of electrode portions 7 placed in the environs of each of the thin film magnetic elements 5, the same for all thin film magnetic elements 5, even if stress is applied to electrode portions 7 at the time of mounting of the semiconductor device 1 on the mounting board, fluctuations due to the same stress can be made to cancel by having the thin film magnetic elements 5 form a bridge, so that the sensitivity of the thin film magnetic elements 5 is stable regardless of the stress.

Figure 5:
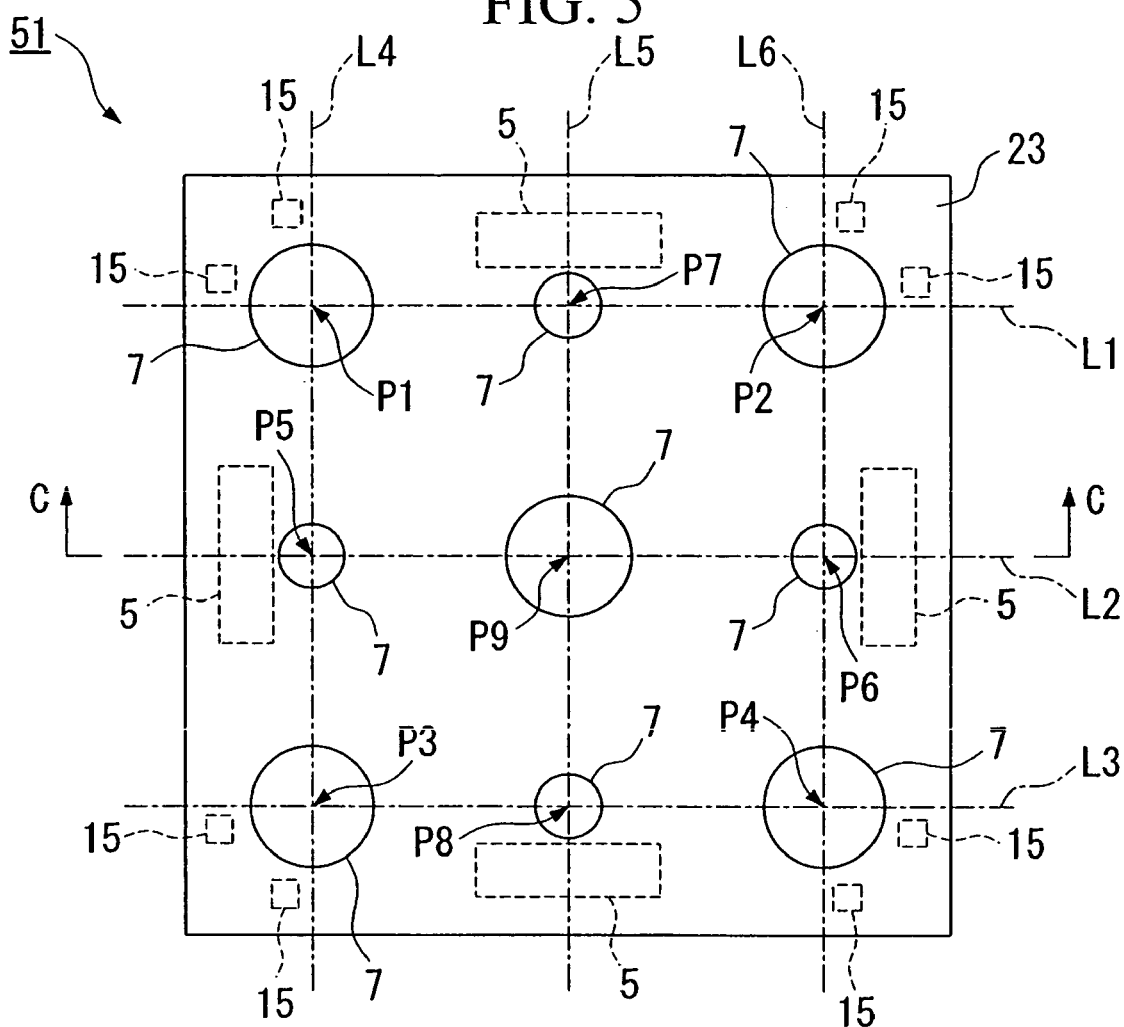
FIG. 5 is a summary plane view showing the semiconductor device of another aspect of the invention.

In the above aspect, one electrode portion 7 is placed in each of the positions shifted from the second and third points of intersection P5 to P8 adjacent to thin film magnetic elements 5; however, the configuration is not limited to this, and it is sufficient to place electrode portions in positions which, at least, do not overlap with thin film magnetic elements 5 in the thickness direction of the semiconductor chip 3. That is, as for example shown in FIG. 5, electrode portions 7 may be placed in the second and third points of intersection P5 to P8 adjacent to thin film magnetic elements 5, forming each of the electrode portions 7 in a size such that there is no overlap in the thickness direction. In the case of this configuration, electrode portions 7 can be placed at all of the points of intersection P1 to P9.

Figure 6:
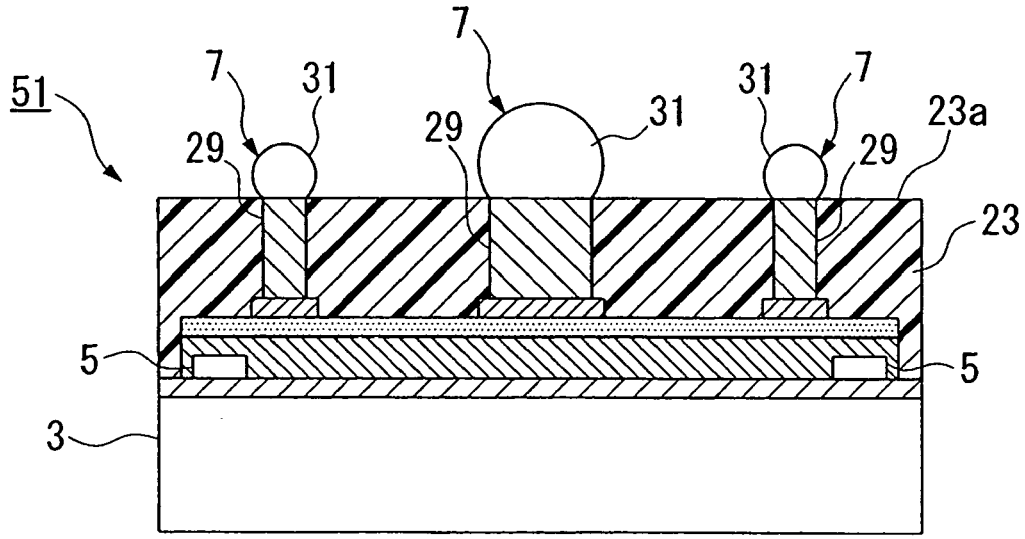
FIG. 6 is a cross-sectional view along arrow C-C of the semiconductor device in FIG. 5.

In the case of the above configuration, as shown in FIG. 6, the solder balls 31 of some electrode portions 7, positioned adjacent to thin film magnetic elements 5, are smaller in diameter than the other solder balls 31 of electrode portions 7 positioned at a distance from the thin film magnetic elements 5. That is, the protrusion lengths of certain solder balls 31 protruding from the surface 23*a* of the resin mold portion 23 are shorter than those of the other solder balls 31. Consequently when mounting the semiconductor device 51 onto the mounting surface of the mounting board while heating the solder balls 31, the other solder balls 31 make contact with the mounting surface of the mounting board before the certain solder balls 31. Hence when mounting the semiconductor device 51 on the mounting board, the stress at electrode portions 7 having the certain solder balls 31 is relaxed, and the stress at these electrode portions 7 which reaches the thin film magnetic elements 5 can be further reduced.

In the above configuration, the shape of the solder balls 31 is not limited to a spherical shape; by providing protruding portions which at least protrude from the surface 23*a* of the resin mold portion 23, and by making the protrusion lengths of certain protruding portions positioned adjacent to thin film magnetic elements 5 shorter than those of other protruding portions positioned at a distance from the thin film magnetic elements 5, a similar advantageous result can be obtained.

Figure 7:
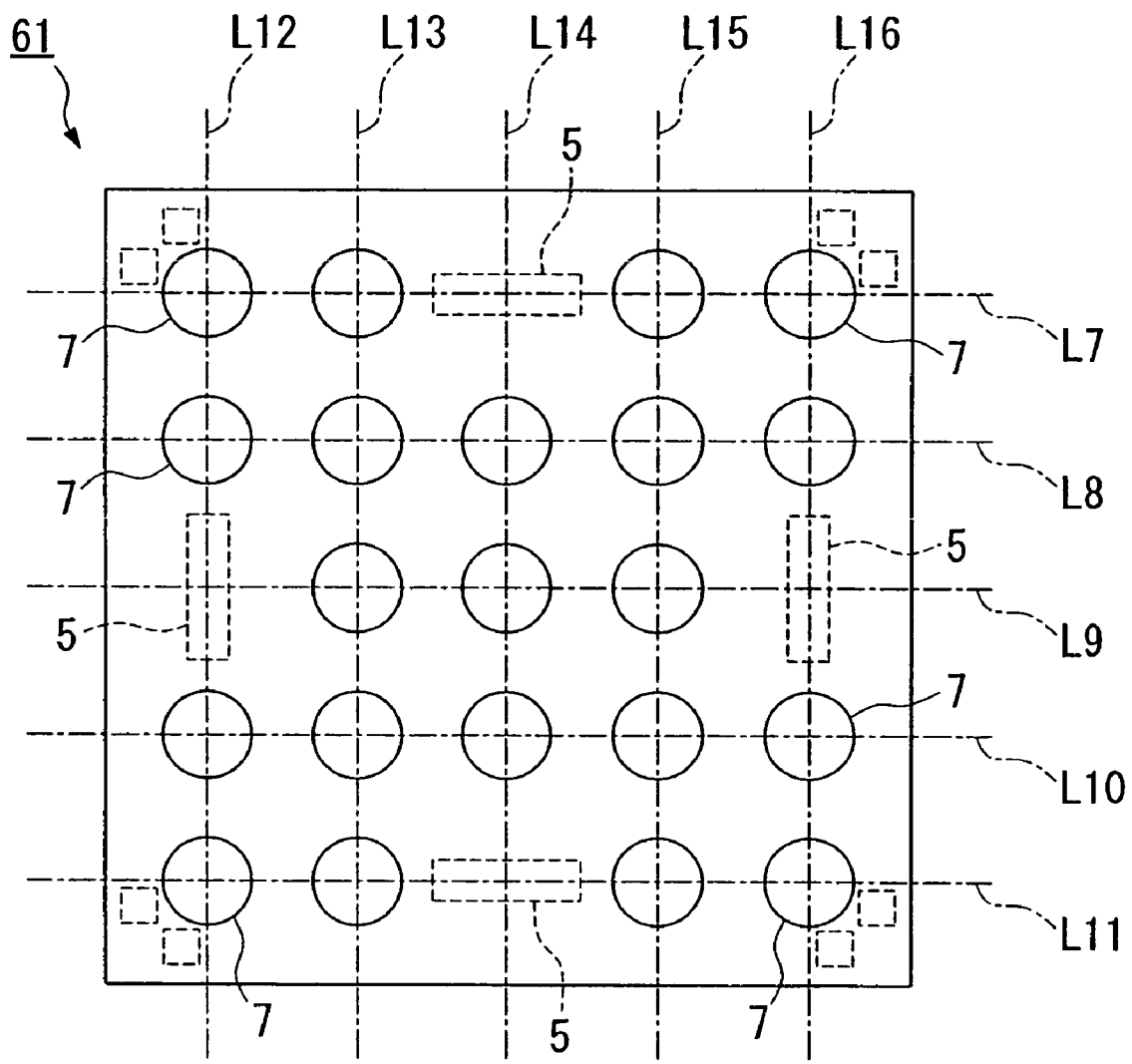
FIG. 7 is a summary plane view showing the semiconductor device of another aspect of the invention.

As shown in FIG. 7, when the number of electrode portions 7 is sufficiently great that, with the semiconductor device 61 mounted on the mounting board, the stress born by each of the electrode portions 7 is equal to or less than a prescribed value, a smaller number of electrode portions 7 may be placed than there are points of intersection of the first lattice lines L7 to L11 with the second lattice lines L12 to L16. Hence this semiconductor device 61 may be configured with electrode portions 7 placed neither to overlap thin film magnetic elements 5 nor placed at adjacent points of intersection.

Thin film magnetic elements 5 are provided on the semiconductor devices 1, 51, 61, but the device configuration is not limited to this, and Hall elements, piezo elements, or, at least, sensor elements having electrical functions, may be provided on the device.

Figure 8:
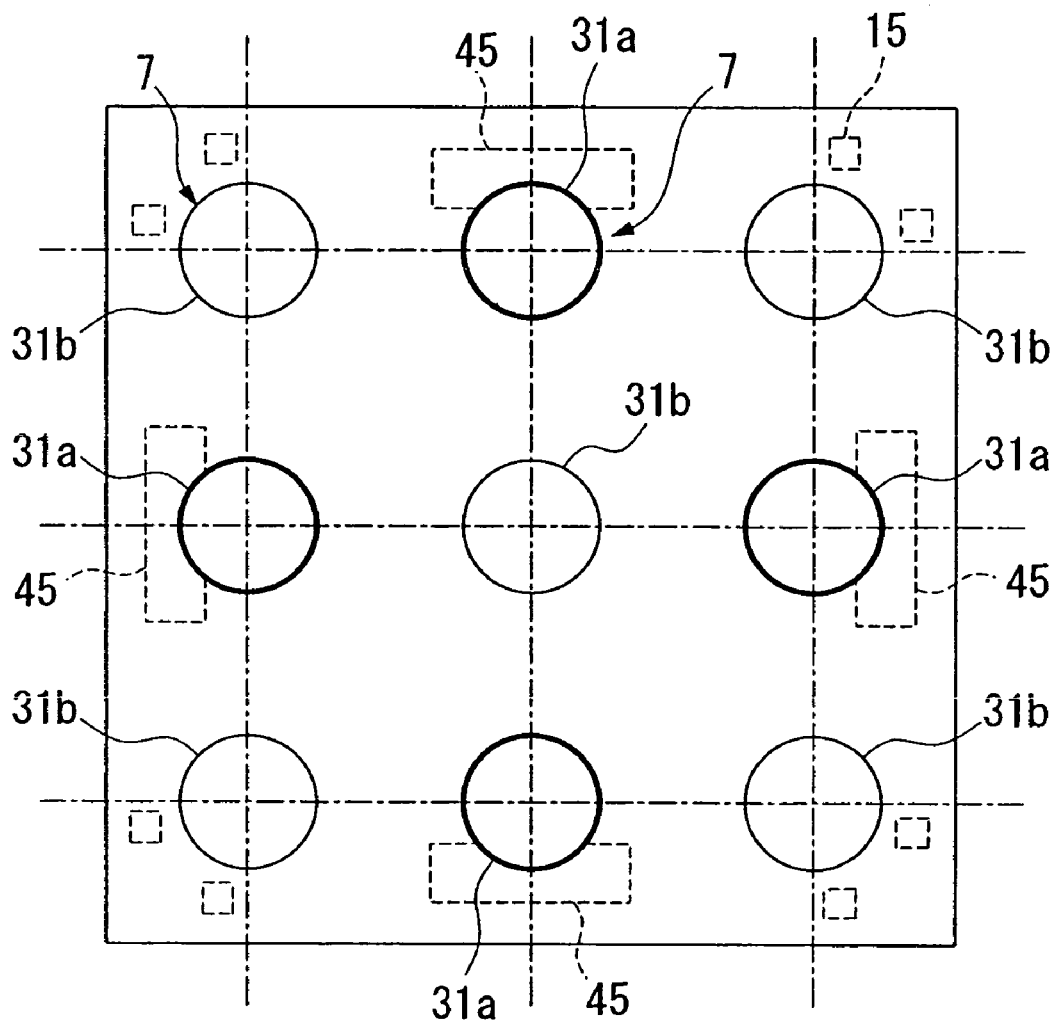
FIG. 8 is a summary plane view showing the semiconductor device of another aspect of the invention.

The electrode portions 7 are described as having been placed in positions which do not overlap with sensor elements in the thickness direction of the semiconductor chip 3; but when the sensor elements are not affected by the current-induced magnetic fields of the electrode portions 7 or wiring portions 9, this configuration is not necessary, and it is sufficient that the stress on the electrode portions 7 which reaches the sensor elements be reduced. That is, as for example shown in FIG. 8, certain solder balls 31a of electrode portions 7 placed at positions which overlap with sensor elements 45 may be formed from a conductive material with a lower melting point than the other solder balls 31b of electrode portions 7 placed at a distance from the sensor elements 45.

In the case of this configuration, when mounting the semiconductor device on the mounting surface of the mounting substrate while heating the solder balls 31a and 31b, the certain solder balls 31a melt before the other solder balls 31b, so that stress is concentrated on the electrode portions 7 having the other solder balls 31b, rather than on the electrode portions 7 having the certain solder balls 31a. Hence even if electrode portions 7 are placed at positions overlapping with sensor elements 45, the stress on the electrode portions 7 having certain solder balls 31a can be relaxed, and the stress at these electrode portions 7 which reaches the sensor elements 45 can be reduced.

Figure 9A:
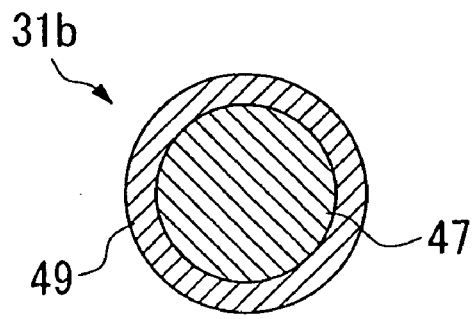
FIG. 9A is a cross-sectional view of a solder ball placed in a position at a distance from a thin film magnetic element.
Figure 9B:
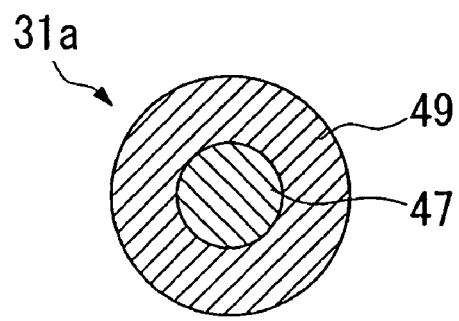
FIG. 9B is a cross-sectional view of a solder ball placed in a position overlapping the thin film magnetic element.

Further, as shown in FIG. 9A and FIG. 9B, when the solder balls 31 comprise a substantially spherical core 47 formed from conductive material and a shell portion 49 formed from a conductive material with melting point lower than the conductive material of the core, and covering the core 47, the diameters of the cores 47 of certain solder balls 31a placed adjacent to sensor elements 45 may be formed smaller than the cores 47 of the other solder balls 31b, and moreover the shell portions 49 of the certain solder balls 31a and of the other solder balls 31b may be formed to have substantially the same diameter.

In the case of such a configuration, when the semiconductor device is mounted on the mounting substrate while heating the solder balls 31 to a temperature lower than the melting point of the conductive material from which the cores 47 are formed, but higher than the melting point of the conductive material from which the shell portions 49 are formed, only the shell portions 49 of the solder balls 31 are melted. Consequently the cores 47 of the other solder balls 31b with larger diameters make contact with the mounting surface of the mounting board, and the cores 47 of the certain solder balls 31a with smaller diameters do not make contact with the mounting surface. At this time, stress is concentrated at the other solder balls 31b, so that even if the electrode portions 7 having the certain solder balls 31a are placed at positions overlapping sensor elements 45, the stress at the electrode portions 7 having the certain solder balls 31a can be relaxed, and so the stress at the electrode portions 7 which reaches the sensor elements 45 can be reduced.

Figure 10:
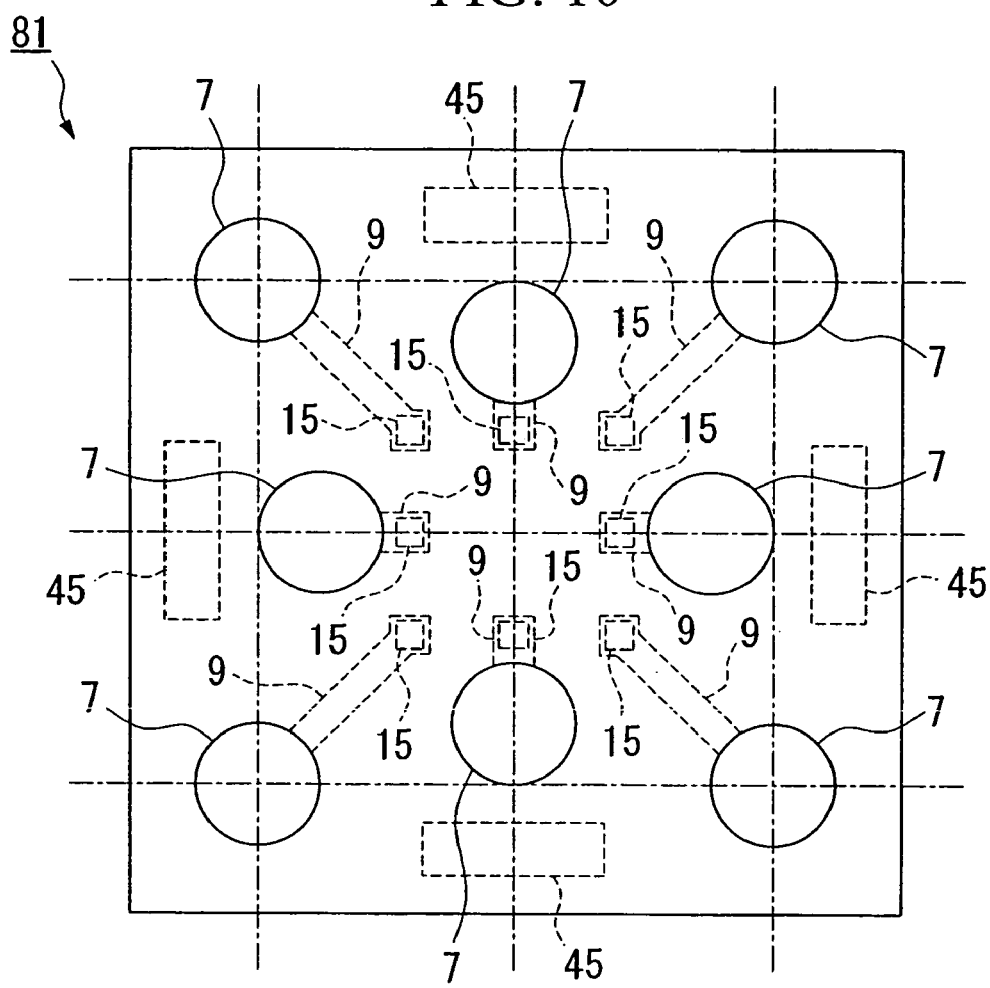
FIG. 10 is a summary plane view showing the semiconductor device of another aspect of the invention.

Further, the pad electrodes 15 of the semiconductor chip 3 were placed on the periphery of the surface 13a of the substrate 13; but configurations are not limited thereto, and as for example shown in FIG. 10, pad electrodes may be placed in the center portion of the surface 13a of the substrate 13.

In the case of a semiconductor device 81 with the above configuration, by placing electrode portions 7 on the outside of these pad electrodes 15, the distances of the wiring portions 9 connecting pad electrodes 15 and electrode portions 7 can be set shorter, so that the semiconductor device 81 can be made to operate under low power.

Further, the sensor elements 45 are placed on the periphery of the main face 3a of the semiconductor chip 3, positioned on the outside of the electrode portions 7, so that the electrode portions 9 can be placed further from the positions of the sensor elements 45.

Hence stress at electrode portions 7 and wiring portions 9 which reaches thin film magnetic elements 5 can be further reduced, and in addition the effect on thin film magnetic elements 5 of the current-induced magnetic fields of the electrode portions 7 and wiring portions 9 can be further decreased, so that fluctuation and degradation of the characteristics of thin film magnetic elements 5 can be reliably suppressed.

Figure 11A:
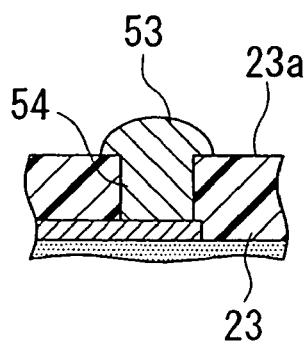
FIG. 11 is an enlarged cross-sectional view showing electrode portions of the semiconductor device of another aspect of the invention.
Figure 11B:
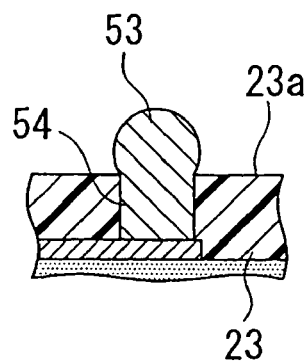
Figure 11C:
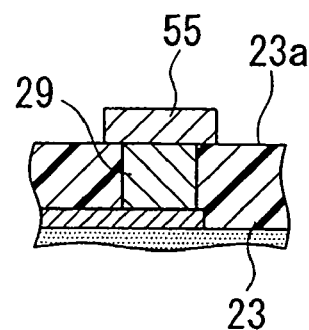
Figure 12:
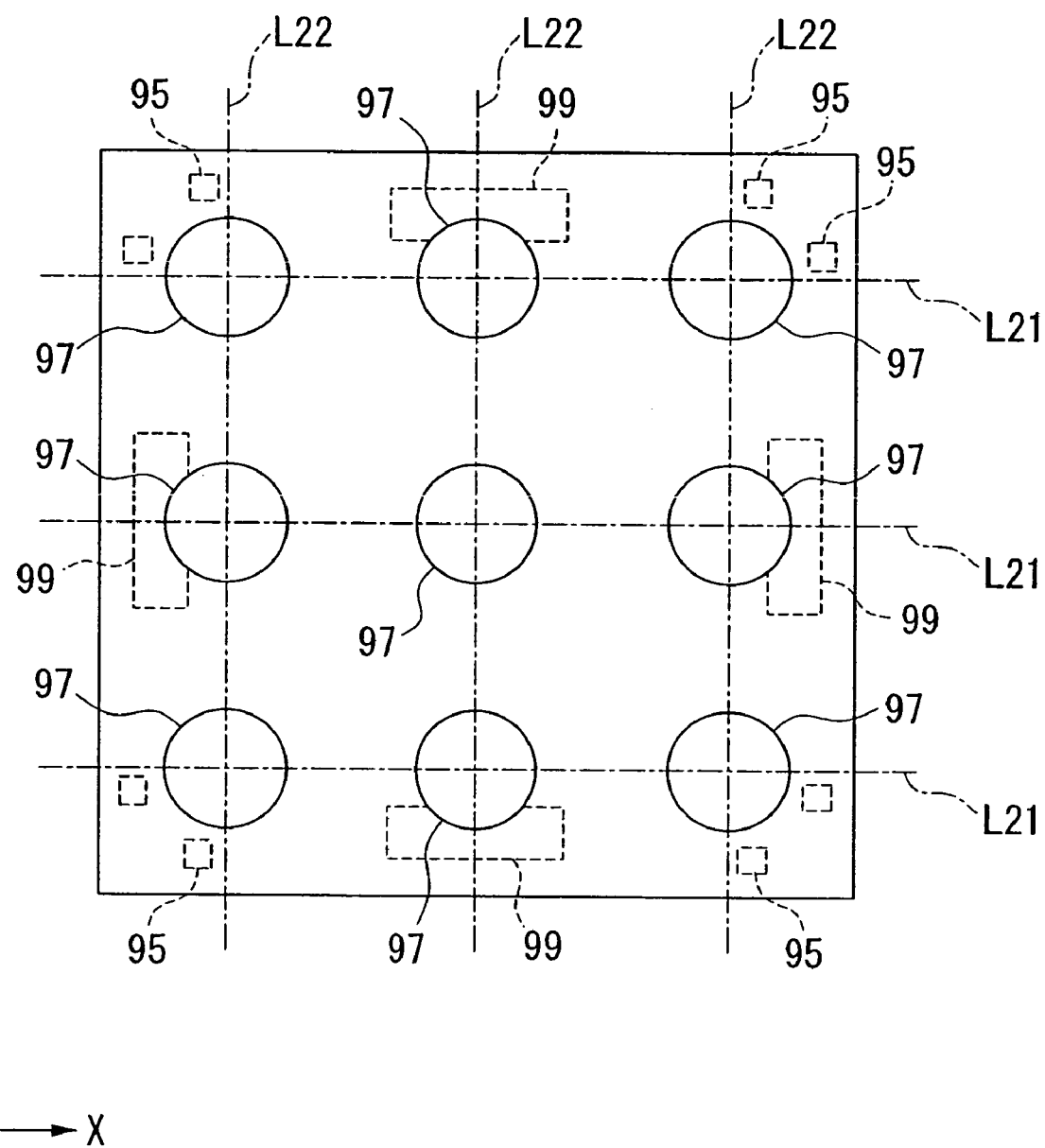
FIG. 12 is a summary plane view showing an example of a semiconductor device of the prior art.

In the above, electrode portions 7 comprised spherical solder balls 31, but other configurations are possible; for example, as shown in FIG. 11, a protruding portion protruding at least from the surface 23a of the resin mold portion 23 may be comprised. That is, as for example shown in (a) and (b) of FIG. 11, protruding portions 53 which protrude from the resin mold portion 23 may be formed integrally with posts 54.

These protruding portions 53 may for example be formed by plating or by screen printing to apply a copper paste. And as shown in (c) of FIG. 11, after forming the posts-29 and resin mold portion 23, resist may be patterned and plating used to form protruding portions 55 with a substantially rectangular shape in cross-sectional view.

In the above configurations, electrode portions 7 comprise posts 29 or 54 and solder balls 31 or protruding portions 53, but electrode portions 7 may also comprise only posts 29 or 54. In the case of such a configuration, when mounting the semiconductor device on a mounting board, the posts 29, 54 are electrically connected with the circuitry of the mounting board using separately supplied solder.

Figure 13:
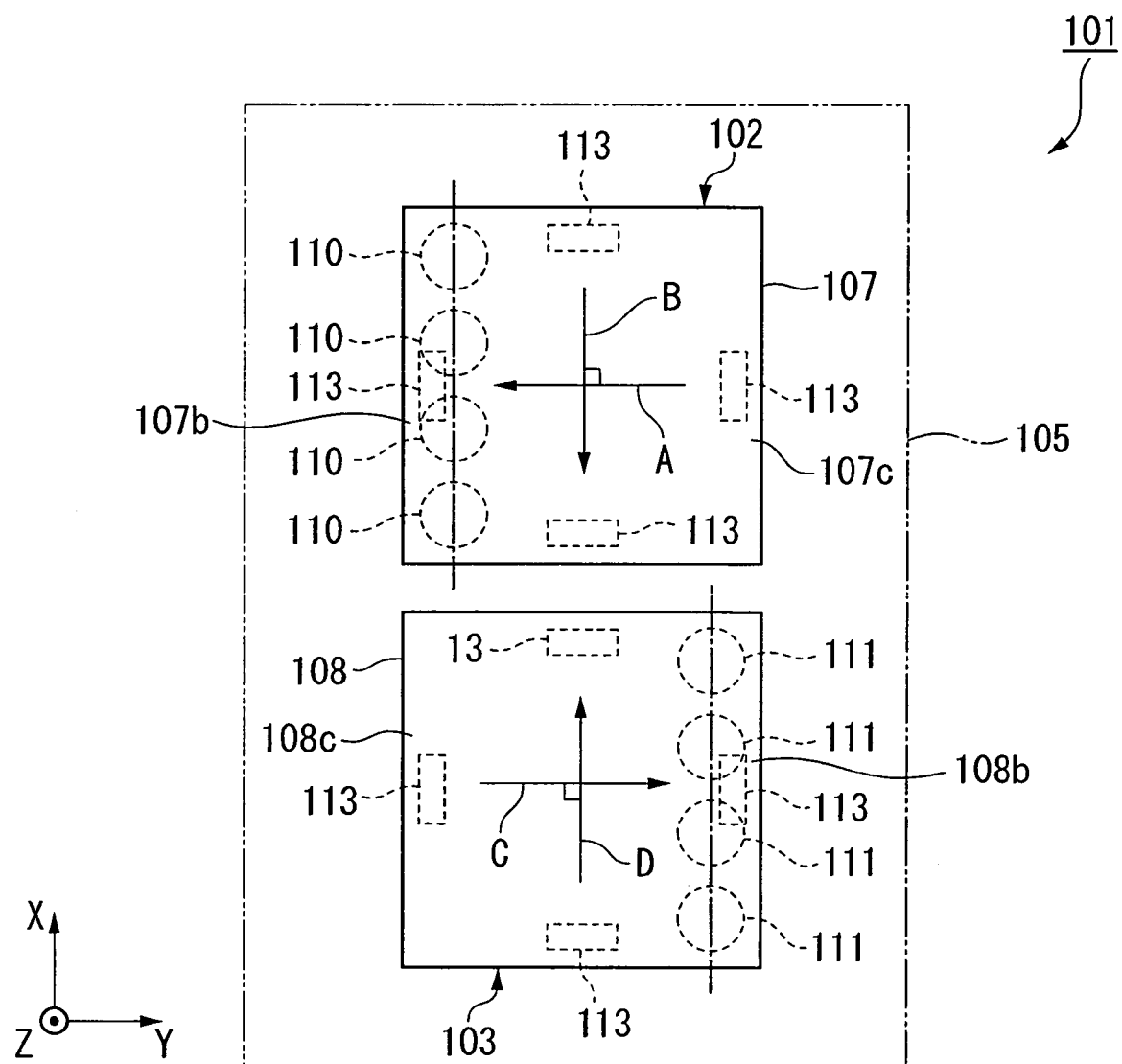
FIG. 13 is a summary plane view showing a magnetic sensor unit of a second aspect of the invention.
Figure 14:
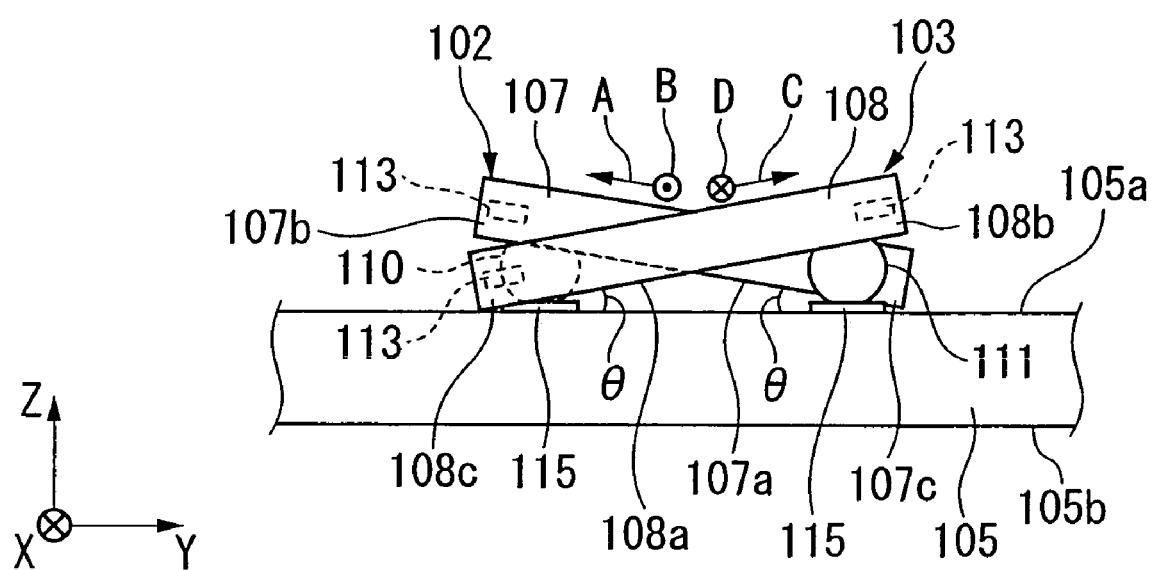
FIG. 14 is a summary side view of the magnetic sensor unit of FIG. 13.

FIG. 13 and FIG. 14 show a second aspect of the invention; the magnetic sensor unit of this aspect measures the sense and magnitude of an external magnetic field. As shown in FIG. 13 and FIG. 14, the magnetic sensor unit 101 comprises two magnetic sensors 102 and 103, and a circuit board 105 on the surface 105a of which the two magnetic sensors 102, 103 are mounted. The circuit board 105 is formed in substantially sheet shape, with the surface 105a and rear surface 105b thereof substantially parallel. On the rear surface 105b of the circuit board 105 are provided terminals (not shown) for electrical connection to the mounting boards of various equipment.

The magnetic sensors 102, 103 are one type of so-called wafer-level CSPs, and comprise magnetic sensor chips 107 and 108 formed in sheets of rectangular shape in plane view, and a plurality of electrode portions 110, 111 provided protruding from the surfaces 107a, 108a of the magnetic sensor chips 107, 108.

Four magnetic sensor elements 113 are provided within the magnetic sensor chips 107 and 108, in thin film form. Each of these magnetic sensor elements 113 senses the magnetic component of an external magnetic field in one direction, and measures the magnitude of the magnetic component in this direction. One each of these magnetic sensor elements 113 is placed at a position adjacent to each of the edges of the surfaces 107a, 108a of the magnetic sensor chips 107 and 108, at a distance from each other, so that the magnetic sensor chips 107 and 108 sense the magnetic components in two orthogonal directions ((A, B) and (C, D)) along the surfaces 107a, 108a.

The electrode portions 110, 111 electrically connect the magnetic sensor chips 107, 108 to the circuit board 105, and are arranged in one row on the surfaces 107a, 108a of the magnetic sensor chips 107 and 108, for example in the direction parallel with one edge 107b, 108b adjacent to one edge of the chip. Each of the electrode portions 110, 111 comprises a solder ball of solder formed into a substantially spherical shape, and all are formed in the same size. These electrode portions 110, 111 can be configured so as to be capable of adhesion to land portions 115 formed on the surface 105a of the circuit board 105, and by this means the magnetic sensors 102, 103 are electrically connected to the circuit board 105.

These magnetic sensors 102 and 103 are placed such that the magnetic sensor chips 107, 108 are inclined with respect to the surface 105a of the circuit board 105. That is, the pluralities of electrode portions 110, 111 protrude from the surfaces 107a, 108a of the magnetic sensor chips 107, 108, arranged in a row along a certain edge 107b, 108b, in the direction parallel to the edges 107b, 108b. Consequently with the pluralities of electrode portions 110, 111 in contact with land portions 115 of the circuit board 105, the other edges 107c, 108c on the side opposite the certain edges 107b, 108b of the magnetic sensor chips 107, 108 on which are placed the electrode portions 110, 111 are in contact with the surface 105a of the circuit board 105. Hence the magnetic sensor chips 107, 108 are inclined such that the surfaces thereof 107a, 108a gradually move away from the surface 105a of the circuit board 105 in moving from the other edge 107c, 108c toward the certain edge 107b, 108b. The directions of inclination of the magnetic sensors 102, 103 are directions orthogonal to the direction of arrangement of the two magnetic sensors 102, 103.

Further, the two magnetic sensors 102, 103 are placed such that the certain edge 107b of one of the magnetic sensors 102 and the other edge 108c of the other magnetic sensor 103 are adjacent, and moreover the other edge 107c of one of the magnetic sensors 102 and the certain edge 108b of the other magnetic sensor 103 are adjacent. Consequently the two magnetic sensor chips 107, 108 are inclined in opposite directions. The two magnetic sensor chips 107, 108 are inclined by an angle of inclination θ with respect to the surface 105a of the circuit board 105 which is of the same magnitude.

The directions of sensitivity A through D of the two magnetic sensors 102 and 103 placed as described above are as follows. In the figures, the X axis and Y axis denote mutually orthogonal directions along the surface 105a of the circuit board 105, and the Z axis denotes the thickness direction of the circuit board 105.

The direction of sensitivity A of one of the magnetic sensors 102, orthogonal to the direction of placement of the electrode portions 110, is the direction inclined by the angle θ from the negative Y-axis direction toward the positive Z-axis direction. The direction of sensitivity B of the magnetic sensor 102, orthogonal to the direction of sensitivity A, is the negative X-axis direction. The direction of sensitivity C of the other magnetic sensor 103, orthogonal to the direction of placement of the electrode portions 111, is the direction inclined by the angle θ from the positive Y-axis direction toward the positive Z-axis direction. The direction of sensitivity D of the other magnetic sensor 103, orthogonal to the direction of sensitivity C, is the positive X-axis direction.

Hence the direction of sensitivity A of one of the magnetic sensors 102 is a direction which intersects the plane comprising the two directions of sensitivity C, D of the other magnetic sensor 103. Similarly, the direction of sensitivity C of the other magnetic sensor 103 is a direction which intersects the plane comprising the two directions of sensitivity A, B of the one magnetic sensor 102.

A magnetic sensor unit 1 configured as described above detects magnetic components in each of the X-axis, Y-axis, and Z-axis directions, and outputs output values (below, also called sensitivity) $S_x$, $S_y$, $S_z$ which are substantially proportional to the respective magnetic components. The sensitivities $S_x$, $S_y$, $S_z$ of the magnetic sensor unit 101 may be expressed as follows, using the sensitivities $S2_x$, $S2_y$, $S3_x$, $S3_y$ of the magnetic sensors 102, 103.

$S_x = S2_x + S3_x$
$S_y = (S2_y + S3_y)\cos\theta$
$S_z = (S2_y + S3_y)\sin\theta$ The sensitivities $S2_x$, $S2_y$ denote the sensitivities in the directions of sensitivity B, A respectively of the magnetic sensor 102, and the sensitivities $S3_x$, $S3_y$ denote the sensitivities in the directions of sensitivity D, C respectively of the magnetic sensor 103.

Referring to the above equations, if the range of the angle of inclination θ is 0°<θ<90°, then the direction of a magnetic field can be measured as a vector in three-dimensional space. If the angle of inclination θ of the magnetic sensor chips 107, 108 is smaller than 45°, then the sensitivity in the Z-axis direction $S_z$ is lower than the sensitivity in the Y-axis direction $S_y$. Conversely, if the angle of inclination θ is greater than 45°, the sensitivity in the Y-axis direction $S_y$ is lower than the sensitivity in the Z-axis direction $S_z$. Hence by setting the angle of inclination θ to 45°, the sensitivity along the axis with the lowest sensitivity can be increased.

This angle of inclination θ can be set appropriately by changing the diameters of the electrode portions 110 and 111, that is, by changing the protrusion lengths of the electrode portions 110, 111 protruding from the surfaces 107a, 108a of the magnetic sensor chips 107, 108.

By means of the above magnetic sensors 102 and 103, because pluralities of electrode portions 110, 111 are arranged in a row to protrude from the surfaces 107a, 108a of the magnetic sensor chips 107, 108, directions of magnetic sensitivity of the magnetic sensor chips 107, 108 are inclined with respect to the surface 105a of the circuit board 105, so that a magnetic component in a direction intersecting the surface 105a of the circuit board 105 can be detected by the magnetic sensor chips 107, 108.

Further, the electrode portions 110, 111 need only be fixed to land portions 115 of the circuit board 105, so that the magnetic sensors 102, 103 can be mounted on the circuit board 105 in an inclined state, without heating the entirety of the magnetic sensor chips 107, 108. Hence fluctuation and degradation of the characteristics of the magnetic sensor chips 107, 108 can be prevented, and the direction of a magnetic field can be measured correctly.

Further, by means of the above magnetic sensor unit 101, because magnetic sensors 102, 103 are used in which fluctuation and degradation of the characteristics of the magnetic sensor chips 107, 108 are prevented, the three-dimensional direction of a magnetic field can be measured correctly.

Figure 15:
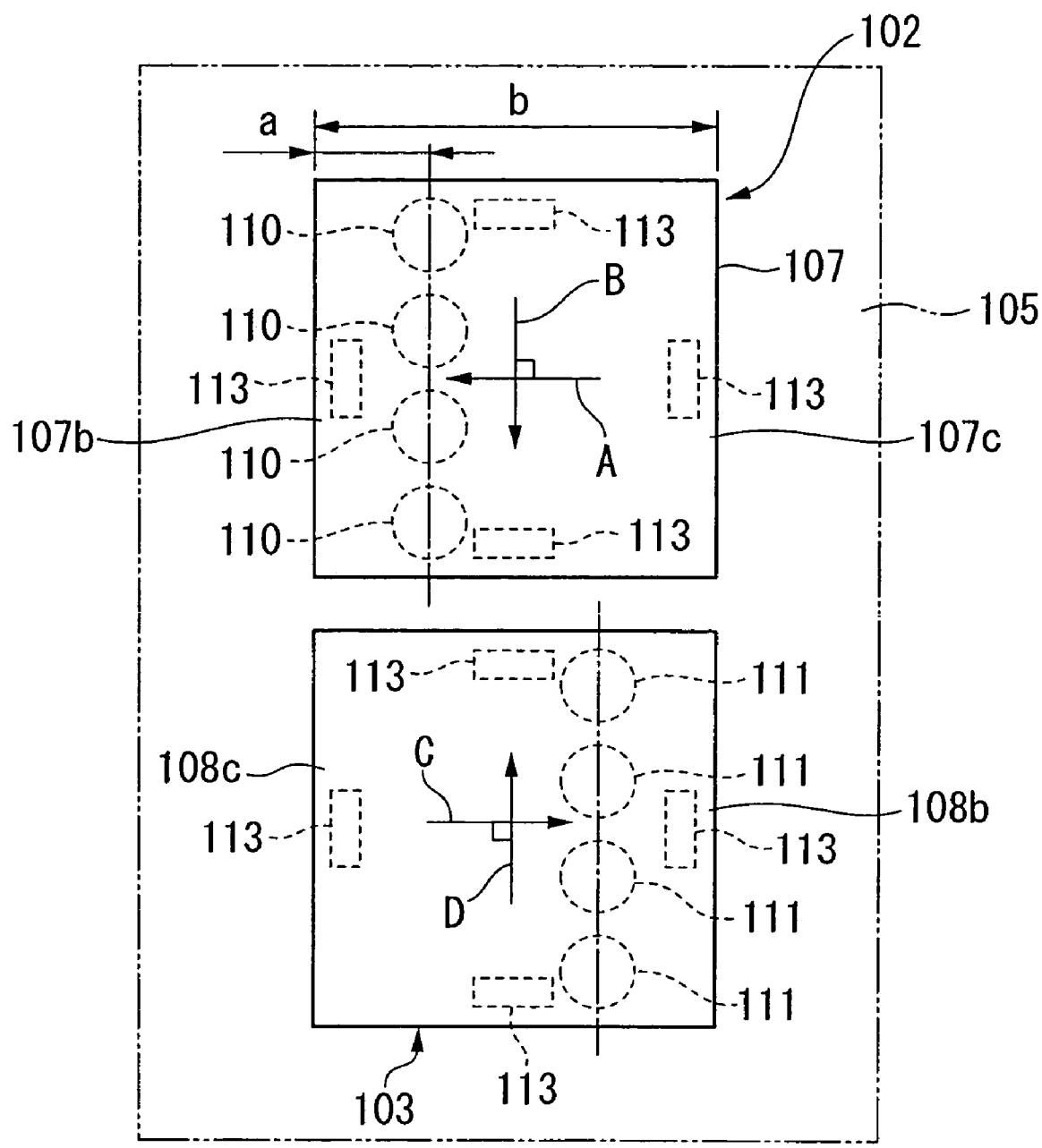
FIG. 15 is a summary plane view showing the magnetic sensor unit of another aspect of the invention.
Figure 16:
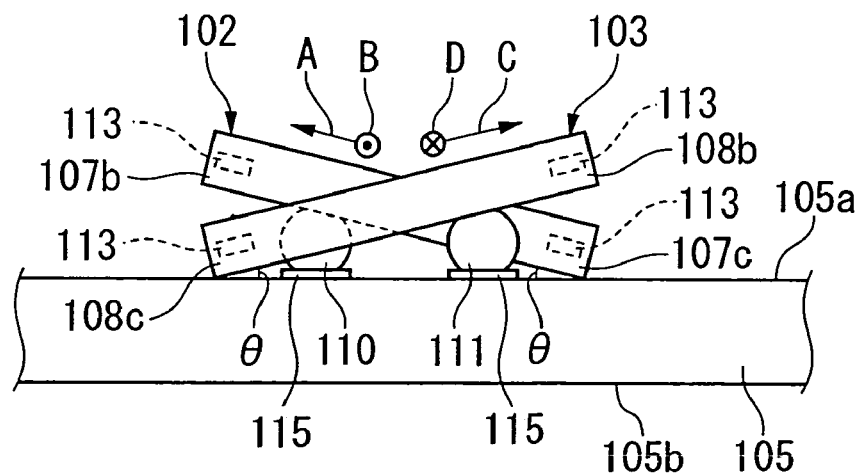
FIG. 16 is a summary side view of the magnetic sensor unit of FIG. 15.

In this second aspect, the angle of inclination θ of the magnetic sensor chips 107, 108 is set by changing the protrusion length of the electrode portions 110, 111 placed on one edge 107b, 108b of the magnetic sensor chips 107, 108; but other configurations are possible, and the angle of inclination θ may be set through the placement of the electrode portions 110, 111 with respect to the magnetic sensor chips 107, 108. That is, as for example in FIG. 15 and FIG. 16, the positions of the pluralities of electrode portions 110, 111 placed in a row may be shifted from the one edge 107b, 108b toward the other edge 107c, 108c of the magnetic sensor chips 107, 108, to increase the angle of inclination θ. In the case of this configuration, the electrode portions 110, 111 and the magnetic sensor elements 113 do not overlap in the thickness direction of the magnetic sensor chips 107, 108, so that when mounting the magnetic sensors 102, 103 on the circuit board 105, stress from the electrode portions 110, 111 can be suppressed, and fluctuations in the characteristics of the magnetic sensor elements 113 arising from this stress can be suppressed.

Figure 17:
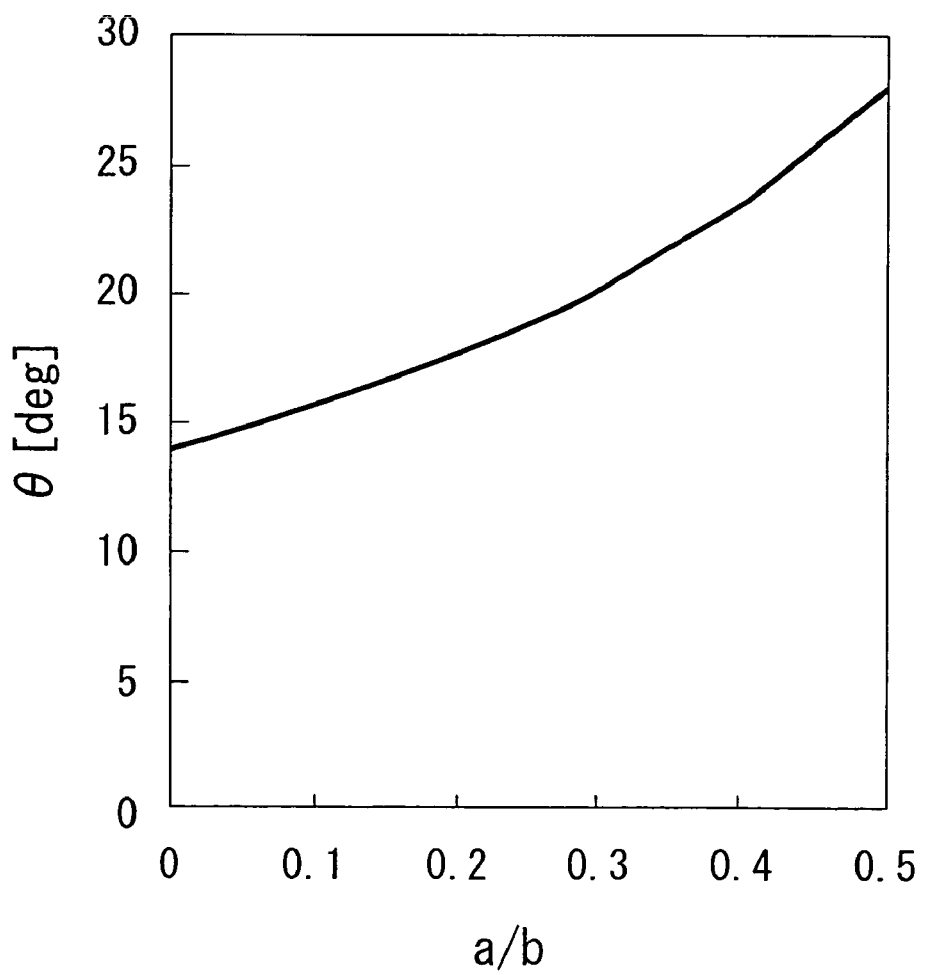
FIG. 17 is a graph showing the relation between the electrode portion position and the angle of inclination θ for the magnetic sensor unit of FIG. 15.

Here, if a is the length from the one edge 107b, 108b of the magnetic sensor chips 107, 108 to the positions of the electrode portions 110, 111 on the magnetic sensor chips 107, 108, and b is the length from the one edge 107b, 108b of the magnetic sensor chips 107, 108 to the other edge 107c, 108c, then as shown in FIG. 17, the greater is the ratio of a to b, the larger is the angle of inclination θ of the magnetic sensor chips 107, 108. Further, the rate of increase of the angle of inclination θ is greater as a becomes larger.

The values of the angle of inclination θ in this graph are for a case in which the length b of one edge of the magnetic sensor chips 107, 108 is 2.0 mm and the diameter of the electrode portions 110, 111 is 300 μm. Also, in order that short-circuits across electrode portions 110, 111 do not occur, the interval between adjacent electrode portions 110, 111 is 200 μm.

As explained above, when setting the angle of inclination θ, there is no need to change the size of the electrode portions 110, 111, so that the angle of inclination θ can easily be set.

Figure 18:
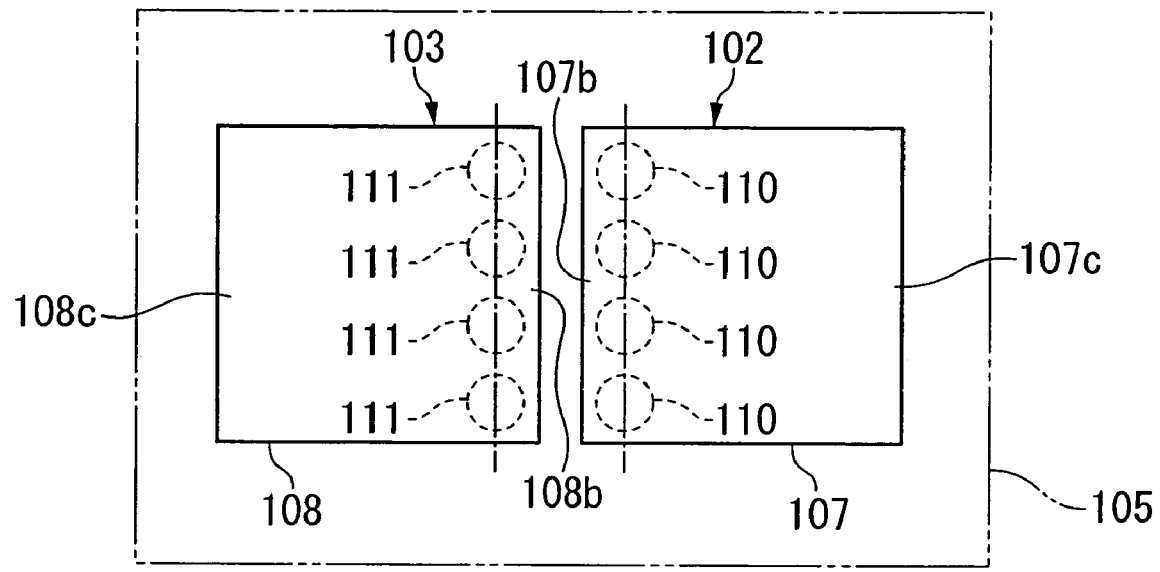
FIG. 18 is a summary plane view showing the magnetic sensor unit of another aspect of the invention.
Figure 19:
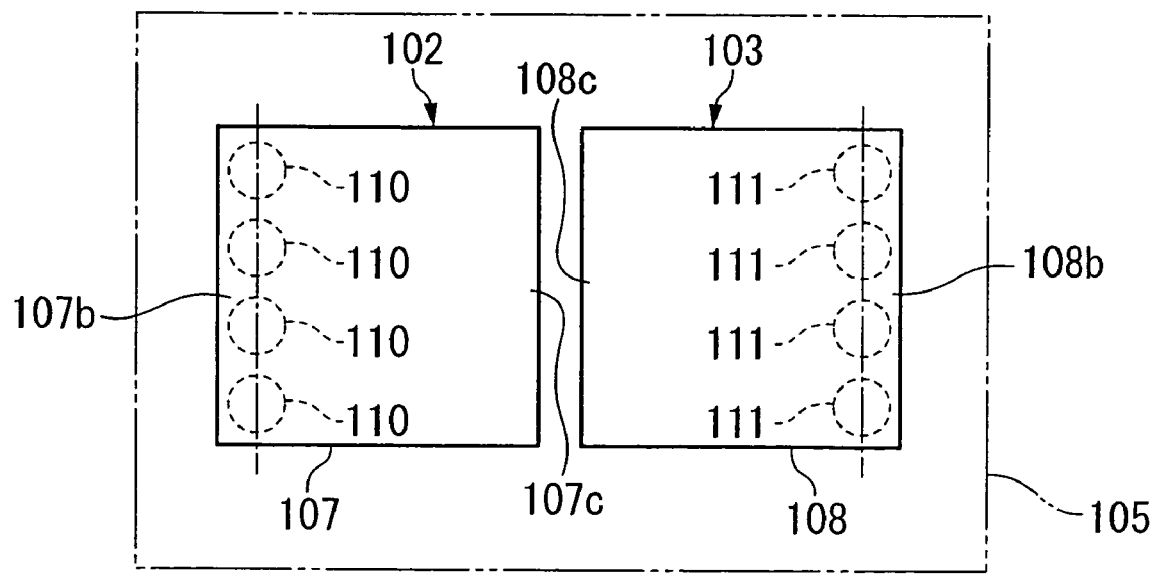
FIG. 19 is a summary plane view showing the magnetic sensor unit of another aspect of the invention.

Further, the two magnetic sensors 102, 103 are placed such that the certain edge 107b of one of the magnetic sensors 102 and the other edge 108c of the other magnetic sensor 103 are adjacent, and moreover the other edge 107c of one of the magnetic sensors 102 and the certain edge 108b of the other magnetic sensor 103 are adjacent; but other configurations are possible. For example, as shown in FIG. 18, the two magnetic sensors 102, 103 may be placed such that the certain edges 107b, 108b of the magnetic sensors 107, 108 are opposed. Or, for example as shown in FIG. 19, the two magnetic sensors 102, 103 may be placed such that the other edges 107c, 108c of the magnetic sensor chips 107, 108 are opposed.

Further, the other edges 107c, 108c of the magnetic sensor chips 107, 108 are brought into contact with the surface 105a of the circuit board 105; but other configurations are possible, and a configuration may be employed in which a cutout portion may be formed in the surface 105a of the circuit board 105, and the other edges 107c, 108c of the magnetic sensor chips 107, 108 are inserted into this cutout portion. In the case of this configuration, the two magnetic-sensors 102, 103 can easily be positioned with respect to the circuit board 105.

Also, in addition to simply bringing the other edges 107c, 108c of the magnetic sensor chips 107, 108 into contact with the surface 105a of the circuit board 105, the other edges 107c, 108c of the magnetic sensor chips 107, 108 may be fixed to the surface 105a of the circuit board 105 using solder.

In the above-described aspect, an example was explained in which the directions of sensitivity A through D and the direction of inclination of the magnetic sensors 102, 103, and the directions of placement of the terminals 110, 111, are either parallel or orthogonal; but other configurations are possible, and the directions of sensitivity A through D and directions of inclination of the magnetic sensors 102, 103, and the directions of placement of the terminals 110, 111, may be at any arbitrary angle between 0° and 90°.

Figure 20:
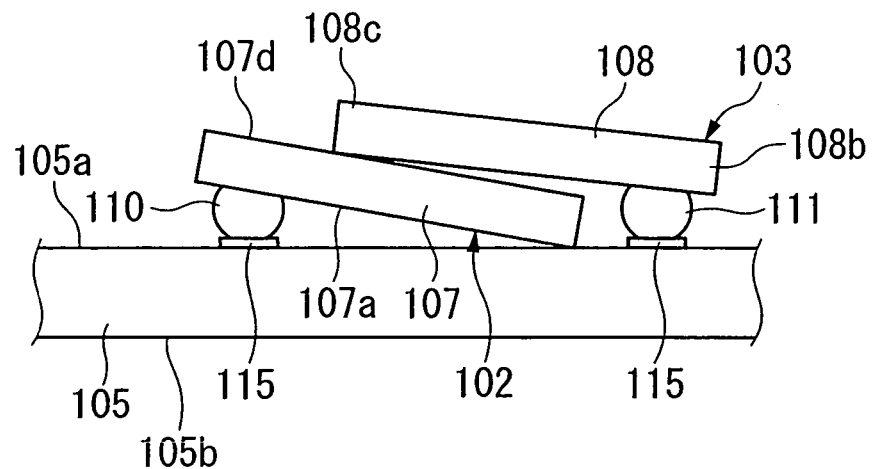
FIG. 20 is a summary plane view showing the magnetic sensor unit of another aspect of the invention.
Figure 21:
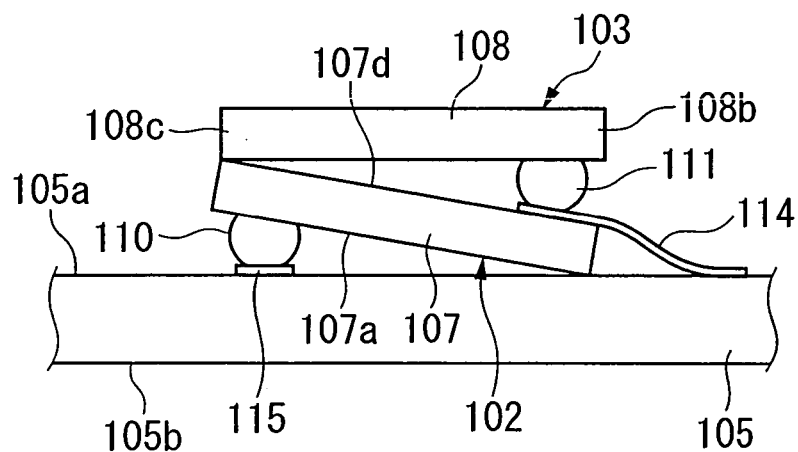
FIG. 21 is a summary plane view showing the magnetic sensor unit of another aspect of the invention.

Further, the magnetic sensors 102, 103 are both placed on the surface 105a of the circuit board 105; but other configurations are possible, and it is sufficient that directions of sensitivity of each of the magnetic sensor chips 107, 108 intersect. Hence as for example shown in FIG. 20, a configuration may be employed in which the other edge 108c of the other magnetic sensor chip 108 is placed on the rear surface 107d of one of the magnetic sensor chips 107, such that a portion of the two magnetic sensor chips 107, 108 overlaps in the thickness direction of the circuit board 105. Or, as for example shown in FIG. 21, the other edge 108c and the electrode portions 111 of the other magnetic sensor 103 are placed on the rear surface 107d of the one magnetic sensor chip 107, such that the entirety of the two magnetic sensor chips 107, 108 overlaps in the thickness direction of the circuit board 105. Here, electrical connection of the electrode portions 111 of the other magnetic sensor 103 with the circuit board 105 may for example be achieved via a bendable flexible wiring plate 114, or wiring placed in the interior of the one magnetic sensor chip 107 may be used to effect the electrical connection.

When, as described above, two magnetic sensors 102, 103 are placed so as to overlap on the surface 105a of a circuit board 105, the mounting area of the two magnetic sensors 102, 103 on the circuit board 105 can be made small, so that the size of the magnetic sensor unit can be reduced.

Figure 22A:
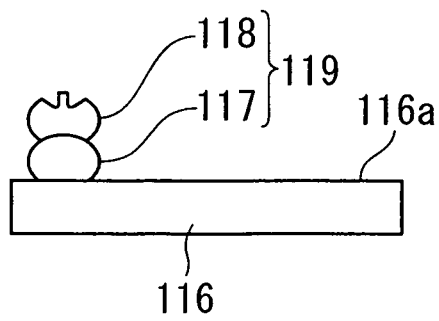
FIG. 22A is a summary side view.
Figure 22B:
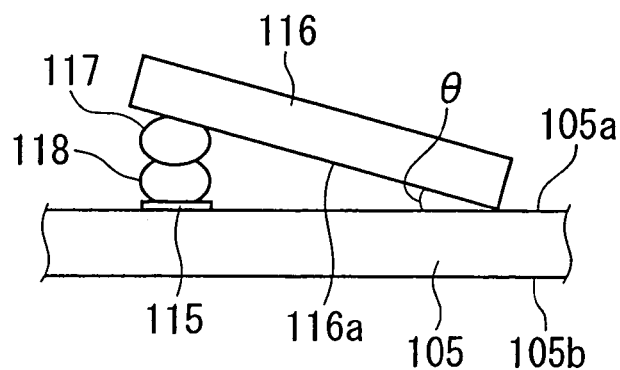
FIG. 22B is a summary side view showing the state of mounting on a circuit board.

Further, the electrode portions 110, 111 are formed from solder balls, but other configurations may be employed, and it is sufficient that the electrode portions 110, 111 protrude from the surfaces 107a, 108a of the magnetic sensor chips 107, 108. That is, as for example shown in FIG. 22A, a configuration may be employed in which a solder ball 117 is placed on the surface 116a of the magnetic sensor chip 116, a ball is formed from gold wire on this solder ball 117, and the tip portion is cut to form a so-called stud bump 118, stacking to obtain the electrode portion 119. In this configuration, as shown in FIG. 22B, the stud bump 118 adheres to the pad portion 115 of the circuit board 105. In the case of this configuration, by stacking stud bumps 118, the amount of protrusion of the electrode portion 119 from the surface 116a of the magnetic sensor chip 116 can be changed, so that the angle of inclination θ can easily be set.

Figure 23:
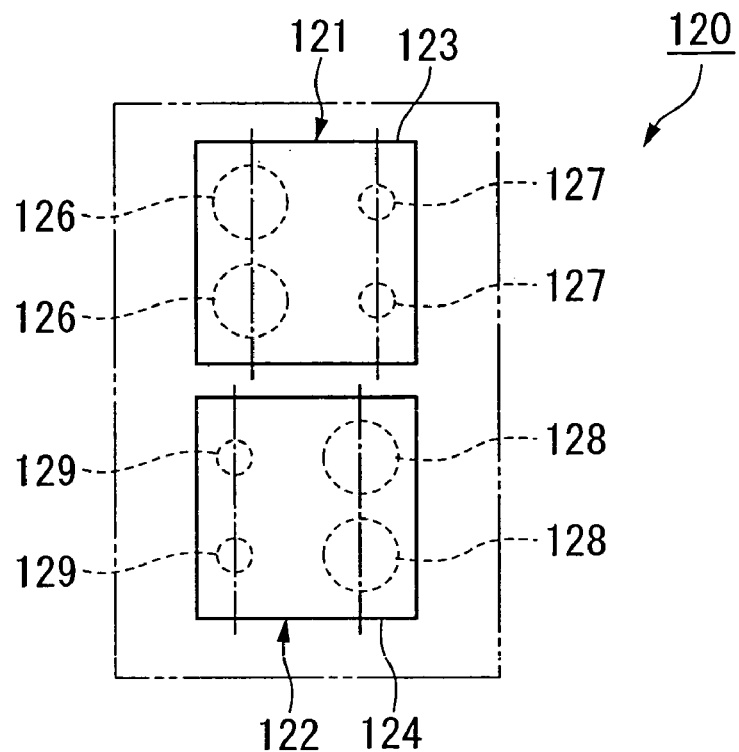
FIG. 23 is a summary plane view showing the magnetic sensor unit of a third aspect of the invention.
Figure 24:
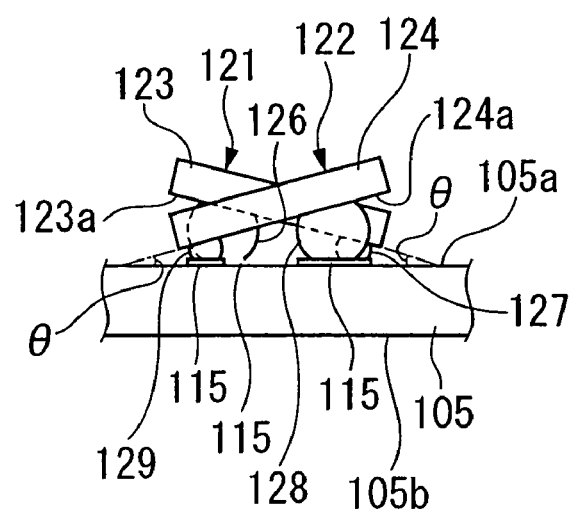
FIG. 24 is a summary side view of the magnetic sensor unit of FIG. 23.

Next, FIG. 23 and FIG. 24 show a third aspect of the invention. The basic configuration of this aspect is the same as that of the magnetic sensor unit 101 shown in FIG. 13 and FIG. 14, but the configuration of each of the magnetic sensors is different. Here, the magnetic sensors in FIG. 23 and FIG. 24 are explained; portions which are the same constituents as in FIG. 13 and FIG. 14 are assigned the same symbols, and explanations are omitted.

As shown in FIG. 23 and FIG. 24, the magnetic sensor unit 120 comprises a circuit board 105 and two magnetic sensors 121, 122 mounted on the surface 105a of the circuit board 105. Each of the magnetic sensors 121 and 122 comprises a magnetic sensor chip 123, 124, and a plurality of electrode portions 126 to 129 provided on the surfaces 123a, 124a thereof. Similarly to those in the second aspect, each of the magnetic sensor chips 123, 124 measures a magnetic component of an external magnetic field, and is sensitive to magnetic components in two orthogonal directions along the surfaces 123a, 124a thereof. The electrode portions 126 to 129 comprise solder balls in which solder is formed into a substantially spherical shape, and are placed separated into two parallel rows.

The electrode portions 126, 128 arranged in one of the rows are formed so as to be larger than the electrode portions 127, 129 arranged in the other row. Consequently, with these electrode portions 126 to 129 adhering to land portions 115 of the circuit board 105, each of the magnetic sensor chips 123, 124 is inclined with respect to the surface 105a of the circuit board 105.

These two magnetic sensors 121, 122 are placed such that the larger electrode portions 126 of one magnetic sensor 121 and the smaller electrode portions 129 of the other magnetic sensor 122 are adjacent, and moreover the smaller electrode portions 127 of the one magnetic sensor 121 and the larger electrode portions 128 of the other magnetic sensor 122 are adjacent. Consequently the two magnetic sensor chips 107, 108 are inclined in opposite directions. These two magnetic sensor chips 107, 108 are inclined at the same angle of inclination θ with respect to the surface 105a of the circuit board 105.

By this means, the plane comprising the two directions of sensitivity of one of the magnetic sensors 121 intersects with at least one of the directions of sensitivity of the other magnetic sensor 122.

By means of the magnetic sensors 121, 122 and the magnetic sensor unit 120, advantageous results similar to those of the second aspect are obtained, and in addition, when the numbers of electrode portions 126 to 129 provided on the surfaces 123a, 124a of the magnetic sensor chips 123, 124 are determined in advance, by arranging the electrode portions 126 to 129 separated into two rows, the number of electrode portions 126 to 129 placed in each row can be reduced, so that the magnetic sensor chips 123, 124 can easily be formed. Hence the magnetic sensors 121, 122 and the magnetic sensor unit 120 can be made smaller.

In this third aspect, all the electrode portions 126 to 129 of the two magnetic sensors 121, 122 are brought into contact with land portions 115 of the circuit board 105; but other configurations may be employed, and it is sufficient that directions of sensitivity of the magnetic sensor chips 123, 124 intersect.

Figure 25:
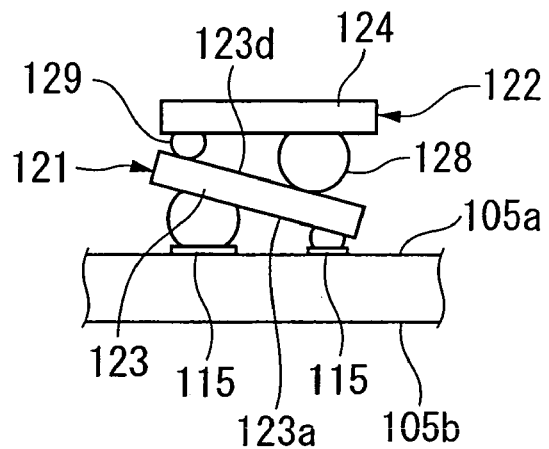
FIG. 25 is a summary side view showing the magnetic sensor unit of another aspect of the invention.

Hence the electrode portions 129 of one row of the other magnetic sensor 122 may be placed on the rear surface of the one magnetic sensor chip 123, such that a portion of the two magnetic sensor chips 123, 124 overlap in the thickness direction of the circuit board 105. Further, as for example shown in FIG. 25, the electrode portions 128, 129 of the other magnetic sensor 122 may be placed on the rear surface 123d of the one magnetic sensor chip 123, so that the entirety of the two magnetic sensors 121, 122 overlap in the thickness direction of the circuit board 105.

As explained above, when two magnetic sensors 121, 122 are placed, overlapping, on the rear surface 105 of a circuit board 105, the mounting area of the two magnetic sensors 121, 122 on the circuit board 105 can be made small, so that the size of the magnetic sensor unit can be reduced.

In the above configuration, electrical connection of the electrode portions 128, 129 of the other magnetic sensor 122 with the circuit board 105 may for example be achieved via a bendable flexible wiring plate 114, or wiring placed in the interior of the one magnetic sensor chip 123 may be used to effect the electrical connection.

Figure 26A:
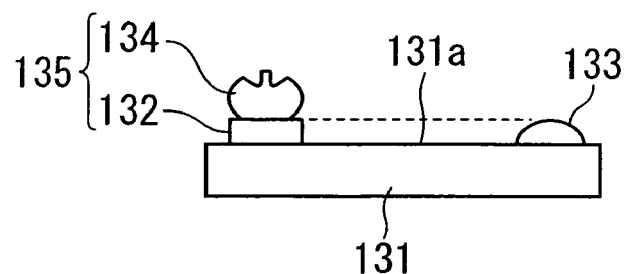
FIG. 26A is a summary side view.
Figure 26B:
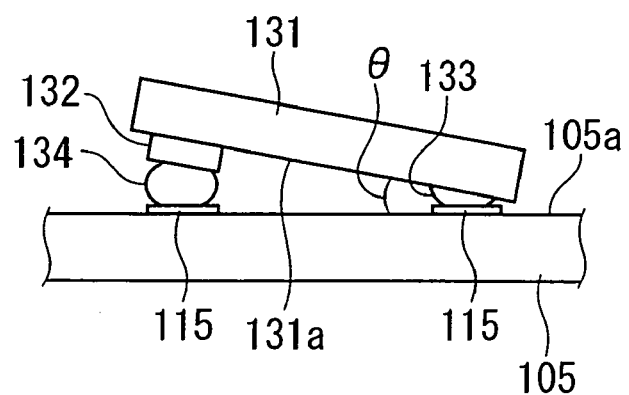
FIG. 26B is a summary side view showing the state of mounting on a circuit board.

Further, the electrode portions 126 to 129 are formed from solder balls, but other configurations may be employed, and it is sufficient that [the electrode portions 126 to 129] protrude from the surfaces 123a, 124a of the magnetic sensor chips 123, 124. That is, as for example shown in FIG. 26A, a configuration may be employed in which solder balls 132, 133 the protrusion amounts from the surface 131a of the magnetic sensor chip 131 of which are equal are placed into two separate rows, and stud bumps 134 are stacked onto only the solder balls 132 in one row to form the electrode portions 135. In such a configuration, as shown in FIG. 26B, the solder balls 133 and stud bumps 134 of the other row adhere to the pad portions 115 of the circuit board 105. In the case of this configuration, by stacking stud bumps 134 onto only the solder balls 132 of one row, the protrusion amounts of the electrode portions 135 can be changed, and so the angle of inclination θ can be easily set.

Further, the electrode portions 126 to 129 are separated and placed in two parallel rows; but other configurations are possible, and it is sufficient that placement be such that the surfaces 123a, 124a of the magnetic sensor chips 123, 124 are inclined with respect to the surface 105a of the circuit board 105. That is, the electrode portions need only be placed on the surfaces of the magnetic sensor chips arranged into a plurality of parallel rows along the surface of the magnetic sensor chip, with protrusion lengths decreasing gradually in the direction of placement of the plurality of rows.

In the magnetic sensor units 101, 120 described in the second and third aspects, the magnetic sensors 102, 103, 121, 122 are sensitive to magnetic components of a magnetic field in two directions; but this is not necessary, and it is sufficient to use at least two magnetic sensors 102, 103, 121, 122 to measure the direction of a magnetic field as a vector in three-dimensional space. That is, it is sufficient that one magnetic sensor be sensitive to magnetic components in two directions, and that the other magnetic sensor be sensitive in one direction intersecting with the plane comprising the two directions of sensitivity of the one magnetic sensor.

Further, the two magnetic sensor chips 107, 108, 123, 124 are inclined relative to each other through the placement and sizes of the electrode portions 110, 111, and 126 to 129 of the magnetic sensors 102, 103, 121, 122; but other configurations are possible, and taking the rear surface 105b of the circuit board 105 as reference, it is sufficient that at least one of the magnetic sensor chips be inclined with respect to the rear surface of the circuit board so as to induce a partial change in the sum of the height dimensions of the circuit board and electrode portions in the thickness direction of the circuit board.

Figure 27:
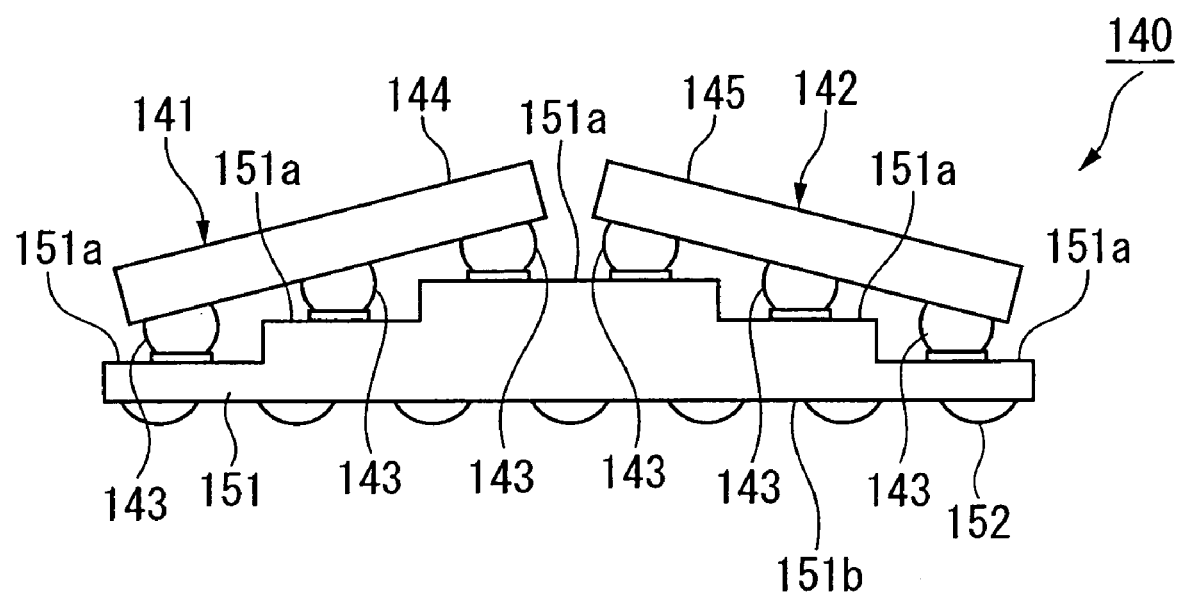
FIG. 27 is a summary side view showing the magnetic sensor unit of another aspect of the invention; and, FIG. 28 is a summary side view showing the magnetic sensor unit of another aspect of the invention.

That is, for example as shown in FIG. 27, the surface of the circuit board 151 may be formed into a staircase shape, and electrode portions 143 of two magnetic sensors 141, 142 placed on the top faces 151a of each of the steps, to configure the magnetic sensor unit 140. In the case of this configuration, the height from the rear surface 151b of the circuit board 151 to the top faces 151b of each of the steps differs, so that even if all the electrode portions of the magnetic sensors 141, 142 are formed in the same size, the magnetic sensor chips 144, 145 of the magnetic sensors 141, 142 can easily be inclined with respect to the rear surface 151b of the circuit board 151.

A BGA (Ball Grid Array) in which solder balls 152 are formed as terminals on the rear surface 151b is used for the circuit board 151 of the magnetic sensor unit 140; but other configurations are possible. For example, in place of the solder balls 152, a PGA (Pin Grid Array) provided with grid pins may be used.

Figure 28:
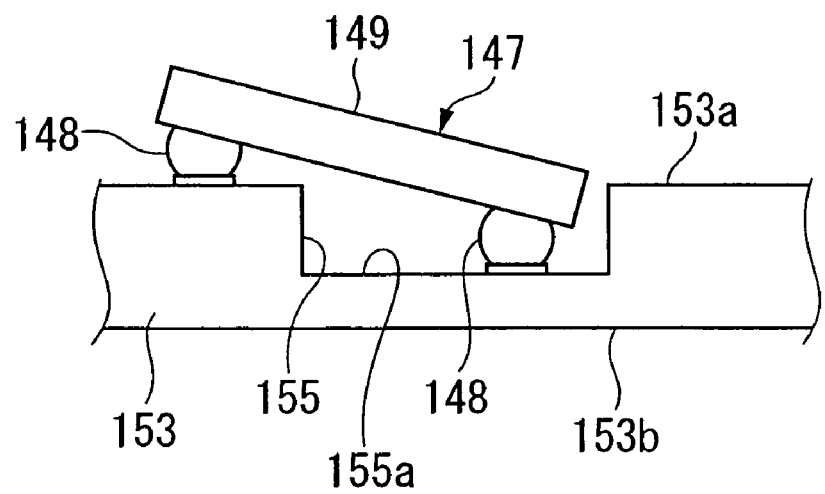

Further, as for example shown in FIG. 28, a groove portion 155 may be formed in the surface 153a of the circuit board 153, and electrode portions 148 of a magnetic sensor 147 placed on the surface 153a of the circuit board 153 and on the floor face (upper face) 155a of the groove portion 155. In the case of this configuration also, the heights from the rear surface 153b of the circuit board 153 to the surface 153a and to the floor face 155a of the groove portion 155 are different, so that the magnetic sensor chip 149 of the magnetic sensor 143 can easily be inclined with respect to the rear surface 153b of the circuit board 153.

The electrode portions 110, 111, and 126 to 129 were formed using solder balls, but it is sufficient that the electrode portions be formed comprising, at least, an object which protrudes from the surface of the magnetic sensor chip; for example, electrode portions may comprise protruding portions formed by plating or by screen printing to apply a copper paste.

In the above, aspects of the invention have been described in detail, referring to the figures. However, specific configurations are not limited to these aspects, but comprise design modifications and similar within a range which does not deviate from the gist of the invention.

What is claimed is:

1. A magnetic sensor, comprising a magnetic sensor chip, formed substantially into a sheet shape, which is sensitive to the magnetic field vector component in at least one direction of a magnetic field, and a plurality of electrode portions, protruding from the surface of said magnetic sensor chip, which electrically connect said magnetic sensor chip to a substantially sheet-shaped circuit board, wherein
   the electrode portions are arranged in a row on the surface of said magnetic sensor chip;
   the magnetic sensor chip has first and second edges substantially parallel and opposite to each other;
   the electrode portions are arranged in a single row substantially parallel and adjacent to the first edge; and
   the magnetic sensor chip is mounted on the circuit board with the first edge being in contact with the circuit board and with the second edge being apart from the circuit board so that the magnetic sensor chip is inclined with respect to the circuit board.

2. A magnetic sensor unit, comprising two of the magnetic sensors according to claim 1, and a circuit board on which are mounted said magnetic sensors with said electrode portions in contact with the surface, wherein
   the magnetic sensor chip of at least one of the magnetic sensors is sensitive to magnetic components of a magnetic field in two directions; and,
   the magnetic sensors are placed on said circuit board, such that the direction of sensitivity of the other magnetic sensor chip intersects the plane comprising the two directions of sensitivity of said one magnetic sensor chip.

3. A magnetic sensor unit, comprising two of the magnetic sensors according to claim 1, and a circuit board on which are mounted said magnetic sensors, wherein
   the magnetic sensor chip of at least one of the magnetic sensors is sensitive to magnetic components of a magnetic field in two directions; and,
   the magnetic sensors are placed on said circuit board, at least partially overlapping, such that the direction of sensitivity of the other magnetic sensor chip intersects the plane comprising the two directions of sensitivity of said one magnetic sensor chip.

4. A magnetic sensor, comprising a magnetic sensor chip, formed substantially into a sheet shape, which is sensitive to the magnetic component in at least one direction of a magnetic filed, and a plurality of electrode portions, protruding from the surface of said magnetic sensor chip, which electrically connect said magnetic sensor chip to a substantially sheet-shaped circuit board, wherein
   the electrode portions are arranged in a plurality of parallel rows on the surface of said magnetic sensor chip; and,
   the protrusion lengths of said electrode portions decrease gradually in the direction of arrangement of said plurality of rows, and
   a circuit board on which are mounted said magnetic sensors with said electrode portions in contact with the surface, wherein
   the magnetic sensor chip of at least one of the magnetic sensors is sensitive to magnetic components of a magnetic field in two directions; and,
   the magnetic sensors are placed on said circuit board, at least partially overlapping, such that the direction of sensitivity of the other magnetic sensor chip intersects the plane comprising the two directions of sensitivity of said one magnetic sensor chip.

5. A magnetic sensor, comprising a magnetic sensor chip, formed substantially into a sheet shape, which is sensitive to the magnetic component in at least one direction of a magnetic field, and a plurality of electrode portions, protruding from the surface of said magnetic sesor chip, which electrically connect said magnetic sensor chip to a substantially sheet-shaped circuit board, wherein
   the electrode portions are arranged in a plurality of parallel rows on the surface of said magnetic sensor chip; and,
   the protrusion lengths of said electrode portions decrease graudually in the direction of arrangement of said plurality of rows, and a circuit board on which are mounted said magnetic sensors, wherein
   the magnetic sensor chip of at least one of the magnetic sensors is sensitive to magnetic components of a magnetic field in two directions; and,
   the magnetic sensors are placed on said circuit board, at least partially overlapping, such that the direction of sensitivity of the other magnetic sensor chip intersects the plane comprising the two directions of sensitivity of said one magnetic sensor chip.

6. A magnetic sensor unit, comprising a first magnetic sensor which is sensitive to the magnetic components of a magnetic field in two directions, a second magnetic sensor which is sensitive to the magnetic component of a magnetic field in at least one direction, and a substantially sheet-shaped circuit board on the surface of which the two magnetic sensors are mounted, wherein
   each of the magnetic sensors comprises a magnetic sensor chip formed in substantially a sheet shape, and a plurality of electrode portions, protruding from the surface of the magnetic sensor chip, which are brought into contact with the surface of said circuit board and are electrically connected to said circuit board; and,
   at least one of the magnetic sensor chips is caused to be inclined with respect to the rear surface of said circuit board, such that the direction of sensitivity of said second magnetic sensor intersects the plane comprising the two directions of sensitivity of said first magnetic sensor, and moreover a first sum of the height dimensions, in the thickness direction of said circuit board, of said circuit board and of said electrode portions at one portion of the magnetic sensor chip is different from a second sum of the height dimensions of said circuit board and of said electrode portions at another portion of the magnetic sensor chip.

7. The magnetic sensor unit according to claim 6, wherein a projection is formed on the front surface of the circuit board so as to form a stair-like shape on the front surface of the circuit board and the electrode portions of at least one magnetic sensor are placed on the top faces of separate steps.

* * * * *